(12) United States Patent
Dayton

(10) Patent No.: US 7,679,462 B2
(45) Date of Patent: Mar. 16, 2010

(54) APPARATUS AND METHOD FOR PRODUCING ELECTROMAGNETIC OSCILLATIONS

(75) Inventor: James A. Dayton, Cleveland, OH (US)

(73) Assignee: Manhattan Technologies, LLC, Cleveland, OH (US)

( * ) Notice: Subject to any disclaimer, the term of this patent is extended or adjusted under 35 U.S.C. 154(b) by 140 days.

(21) Appl. No.: 11/826,396

(22) Filed: Jul. 13, 2007

(65) Prior Publication Data

US 2008/0024236 A1    Jan. 31, 2008

(51) Int. Cl.
*H03B 9/08* (2006.01)

(52) U.S. Cl. .......................................... 331/81; 331/82
(58) Field of Classification Search .................... 331/79, 331/81, 82; 315/5, 3.5; 333/81 A
See application file for complete search history.

(56) References Cited

U.S. PATENT DOCUMENTS

| | | | |
|---|---|---|---|
| 2,880,355 | A | 3/1959 | Bernard |
| 2,888,597 | A | 5/1959 | Jean et al. |
| 2,932,760 | A | 4/1960 | Bernard |
| 3,787,747 | A | 1/1974 | Scott |
| 4,149,107 | A | 4/1979 | Guenard |
| 4,237,402 | A | 12/1980 | Karp |
| 4,409,519 | A | 10/1983 | Karp |
| 4,459,562 | A | 7/1984 | Kosmahl |
| 4,568,009 | A | 2/1986 | Green |
| 4,820,688 | A | 4/1989 | Jasper |
| 4,866,343 | A | 9/1989 | James |
| 5,363,016 | A | 11/1994 | James |
| 5,944,573 | A | 8/1999 | Mearini et al. |
| 6,001,432 | A | 12/1999 | Yamazaki et al. |
| 6,042,900 | A | 3/2000 | Rakhimov et al. |
| 6,110,541 | A | 8/2000 | Lee et al. |
| 6,132,278 | A | 10/2000 | Kang et al. |
| 6,242,740 | B1 | 6/2001 | Luukanen et al. |
| 6,244,212 | B1 | 6/2001 | Takacs et al. |
| 6,301,333 | B1 | 10/2001 | Mearini et al. |
| 6,475,355 | B2 | 11/2002 | Mearini et al. |

(Continued)

FOREIGN PATENT DOCUMENTS

DE        19525199 A1    1/1997

OTHER PUBLICATIONS

A. Karp, "Traveling Wave Tube Experiments at Millimeter Wavelengths with a New, Easily Built, Space-Harmonic Circuit," Proc. I.R.E., vol. 43, pp. 41-46 (1955).

(Continued)

*Primary Examiner*—Joseph Chang
(74) *Attorney, Agent, or Firm*—Duane Morris LLP

(57) ABSTRACT

A device for providing electromagnetic oscillations in the sub-millimeter range comprising one or more electron beam generators for providing a first and a second electron beam and one or more magnetic field generators for focusing the first and second electron beams. The device may comprise an oscillator comprising a slow wave circuit having a structure of an electrically non-conducting material with metallized surfaces adjacent the first electron beam and an amplifier comprising a slow wave circuit having a structure of an electrically non-conducting material with metallized surfaces adjacent the second electron beam and electrically connected to said oscillator. The oscillator and amplifier may be formed on a single substrate utilizing a single deposition process. The oscillator and amplifier may be contained in a single vacuum envelope.

28 Claims, 17 Drawing Sheets

U.S. PATENT DOCUMENTS

| | | | |
|---|---|---|---|
| 6,521,149 | B1 | 2/2003 | Mearini et al. |
| 6,584,675 | B1 | 7/2003 | Rajan et al. |
| 6,656,444 | B1 | 12/2003 | Pinneo |
| 6,686,696 | B2 | 2/2004 | Mearini et al. |
| 6,700,454 | B2 | 3/2004 | Yaniv et al. |
| 6,917,162 | B2 | 7/2005 | Dayton, Jr. |
| 7,037,370 | B2 | 5/2006 | Mearini et al. |
| 7,128,820 | B2 * | 10/2006 | Lee ............................ 205/159 |
| 7,193,485 | B2 | 3/2007 | Dayton, Jr. |
| 7,195,797 | B2 | 3/2007 | Mearini et al. |

OTHER PUBLICATIONS

D. Wilson, "A Millimeter-Wave Tunneladder TWT: Final Report," NASA-CR-182183, Oct. 1982-Jan. 1986 (Varian Associates) (Oct. 1988).

C. Kory and J. A. Dayton, Jr., "Computational Investigation of Experimental Interaction Impedance Obtained by Perturbation for Helical Traveling-Wave Tube Structures," IEEE Transactions on Electron Devices, vol. 45, No. 9, p. 2063, Sep. 1998.

"Principles of Traveling Wave Tubes," A. S. Gilmour, Jr., p. 17-45, Artech House, 1999.

"Principles of Electron Tubes," W. Gewartowski and H. A. Watson, Chapter 11, "Backward Wave Oscillators and Amplifiers," D. Van Nostrand Company, Inc, New Jersey, 1965, pp. 398-422.

"Backward Wave Oscillator Efficiency," R. W. Grow and D. A. Watkins, Proc. IRE, Jul. 1955, pp. 848-856.

"SLAC-166," W. B. Herrmannsfeldt, Stanford Linear Accelerator Center, 1973.

P. Ramins and T. Fox, "90-93 Percent Efficient Collector for Operaiton of a Dual-Mode Traveling-Wave Tube in the Linear Region," IEEE Trans ED vol. 26, pp. 1662-64 (Oct. 1979).

"Field Emitter Arrays for Plasma and Microwave Source Applications," K. Jensen, Physics of Plasmas, vol. 6, No. 5, pp. 2241-2253, May 1999.

"Application of Field Emitter Arrays to Microwave Power Amplifiers," D. R. Whaley, B. M. Gannon, C. R. Smith, C. M. Armstrong and C. A. Spindt, IEEE Trans. Plasma Science, vol. 28, No. 3, pp. 727-747, Jun. 2000.

"Offset Printing of Gasket Seals for Microdisplay Applications," D. J. Davis, J. Gandhi, R. Klouda, Y. Ji, and M. E. Stefanov, International Display Manufacturing Conference, Sep. 2000, Seoul, Korea.

"Auger Electron Spectroscopy of the Hydrogen Terminated Chemical Vapor Deposited Diamond Surface," I. L. Krainsky, G. T. Mearini and V. M. Asnin, Appl. Phys. Lett., 68(14), 2017-2019, Apr. 1996.

Tretyakov, et al., "Compact Tunable Radiation Source at 180-1500 GHz Frequency Range." International Journal of Infrared and Millimeter Waves, vol. 20, No. 8, 1999, pp. 1443-1451.

Mueller, et al., "Field Emission from Gated Diamond Arrays," Applied Surface Science, vol. 146, pp. 328-333, 1999.

"Accurate Cold-Test Model of Helical TWT Slow-Wave Circuits," C. Kory and J. A. Dayton, Jr., IEEE Trans. ED, vol. 45, No. 4, pp. 966-971 (Apr. 1998).

"Effect of Helical Slow-Wave Circuit Variations on TWT Cold-Test Characteristics," C. Kory and J. A. Dayton, Jr., IEEE Trans ED, vol. 45, No. 4, pp. 972-976 (Apr. 1998).

"First Pass TWT Design Success," R. T. Benton, C. K. Chong, W. Menninger, C. B. Thorington, X. Zhai, D. S. Komm and J. Dayton, Jr., IEEE Trans. ED, vol. 48, No. 1, pp. 176-178 (Jan. 2001).

"An In-situ Heating Study of Hydrogen Containing Absorbates on Polycrystalline Diamond Surfaces Using Elastic Recoil Detection," C A. Zorman, G. T. Mearini and R. W. Hoffman, Diam. And Rel. Mat. 9, 1518-1523 (2000).

"Negative-Electron-Affinity Effect on the Surface of Chemical Vapor Deposited Diamond Polycrystalline Films," I. L. Krainsky, V. M. Asnin, G. T. Mearini, and J. A. Dayton, Jr, Phys. Res. B 53, Rapid Communications, R7650, Mar. 1996.

"Electron Emission Observations From As-Grown and Vacuum-Coated Chemical Vapor Deposited Diamond," A. Lamouri, Y. Wang, G. T. Mearini, I. L. Krainsky, J. A. Dayton, Jr., and W. Mueller, J. Vac. Sci. and Tech., B 14(3), 2046-2049, May/Jun. 1996.

"Effects of Surface Treatment on Secondary Electron Emission from CVD Diamond Films," G. T. Mearini, I. L. Krainsky, J. A. Dayton, Jr., C. Zorman, Y. Wang, and A. Lamouri, Diamond Films and Tech., 5(6), 339-351 (1995).

"High Emission Csl Coated Diamond Dynodes for an Electron Multiplier," G. T. Mearini, I. L. Krainsky, J. A. Dayton, Jr., Proc. of Third Int. conf. on the Applications of Diamond Films and Rel. Materials, Aug. 21-24, NIST Special Publication 885 (1995) 13.

"Electron Emission Observations From As-Grown and Vacuum-Coated Chemical Vapor Deposited Diamond," A. Lamouri, G. T. Mearini, Yaxin Wang, and R E. Kusner, Proc. of the Third Int. Conf. on the Applications of Diamond Films and Rel. Materials, Aug. 21-24, NIST Special Publication 885 (1995) 61.

"Investigation of Secondary Electron Emission from CVD Diamond Films for Crossed-Field Device Applications," G. T. Mearini, I. L. Krainsky, and J. A. Dayton, Jr., Proc. of the First Workshop on Crossed-Field Devices, University of Michigan, Ann Arbor, MI (1995) 115-124.

"Electron Emission Observations From As-Grown and Vacuum Coated CVD Diamond," A. Lamouri, Yaxin Wang, G. T. Mearini, I. L. Krainsky, and J. A. Dayton, Jr., Proc. of the International Vacuum Microelectronics Conference, Jul. 29-Aug. 4, Portland, OR (1995) 310-314.

"Stable Secondary Electron Emission from CVD Diamond Films Coated With Alkali-Halides," G.T. Mearini, I.L. Krainsky, J.A. Dayton, Jr., Yaxin Wang, Christian A. Zorman, John C. Angus, RW. Hoffman, and D.F. Anderson, Appl. Phys. Lett., 66(2), 242-244 (1995).

"Stable Secondary Electron Emission Observations from CVD Diamonds," G.T. Mearini, I.L. Krainsky, I.A. Dayton, Jr., Yaxin Wang, Christian A. Zorman, John C. Angus, and R.W. Hoffman, Appl. Phys. Lett., 65(21), 2702-2704 (1994).

"Investigation of Diamond Films for Electronic Devices," G. T. Mearini, I. L. Krainsky, and J. A Dayton, Conference Record, The 1994 Tri-Service/NASA Cathode Workshop, 135-138 (1994).

"Fabrication of an Electron Multiplier Utilizing Diamond Films," G. T. Mearini, I. L. Krainsky, J. A. Dayton, Jr., Y. X. Wang, R. Ramesham, and M. F. Rose, Thin Solid Films, 253(1), 151-156 (1994).

"Investigation of Diamond Films for Electronic Devices," G. T. Mearini, I. L Krainsky, and J. A. Dayton, Jr., Surf. and Int. Anal., 21(2), 138-143 (1994).

"Effect of Hydrogen on the Properties of Polycrystalline Diamond Thin Films," R. Ramesham, M. F. Rose, R. F. Askew, T. L Bekker, J. A Dayton, Jr., I. L Krainsky, G. T. Mearini, D. File, A. S. Gilmour, Jr., and V. Ayers, Surf, and Coatings Technol., 64, 81-86 (1994).

"Observations of Secondary Electron Emission From Diamond Films," T. L Bekker, J. A.Dayton. Jr., A. S. Gilmour, Jr., I. L Krainsky, M. F. Rose, R. Rameshan, D. File, and G. T. Mearini, IEDM IEEE Technical Digest, 949-952 (1992).

"Three-Dimensional Finite Element Analysis of Thin-Film Stresses Using ALGOR Personal-Computer-Based Software," D. Krus, G. T. Mearini, K. Chaffee, and R. W. Hoffman, J. Vac Sci. Technol A9(4), 2488 Jul./Aug. 1991.

International Searching Authority, International Search Report in related international application No. PCT/US2007/016020.

Dayton, et al., "Ultra Small Electron Beam Amplifiers," IEEE, 1986, pp. 780-784.

* cited by examiner

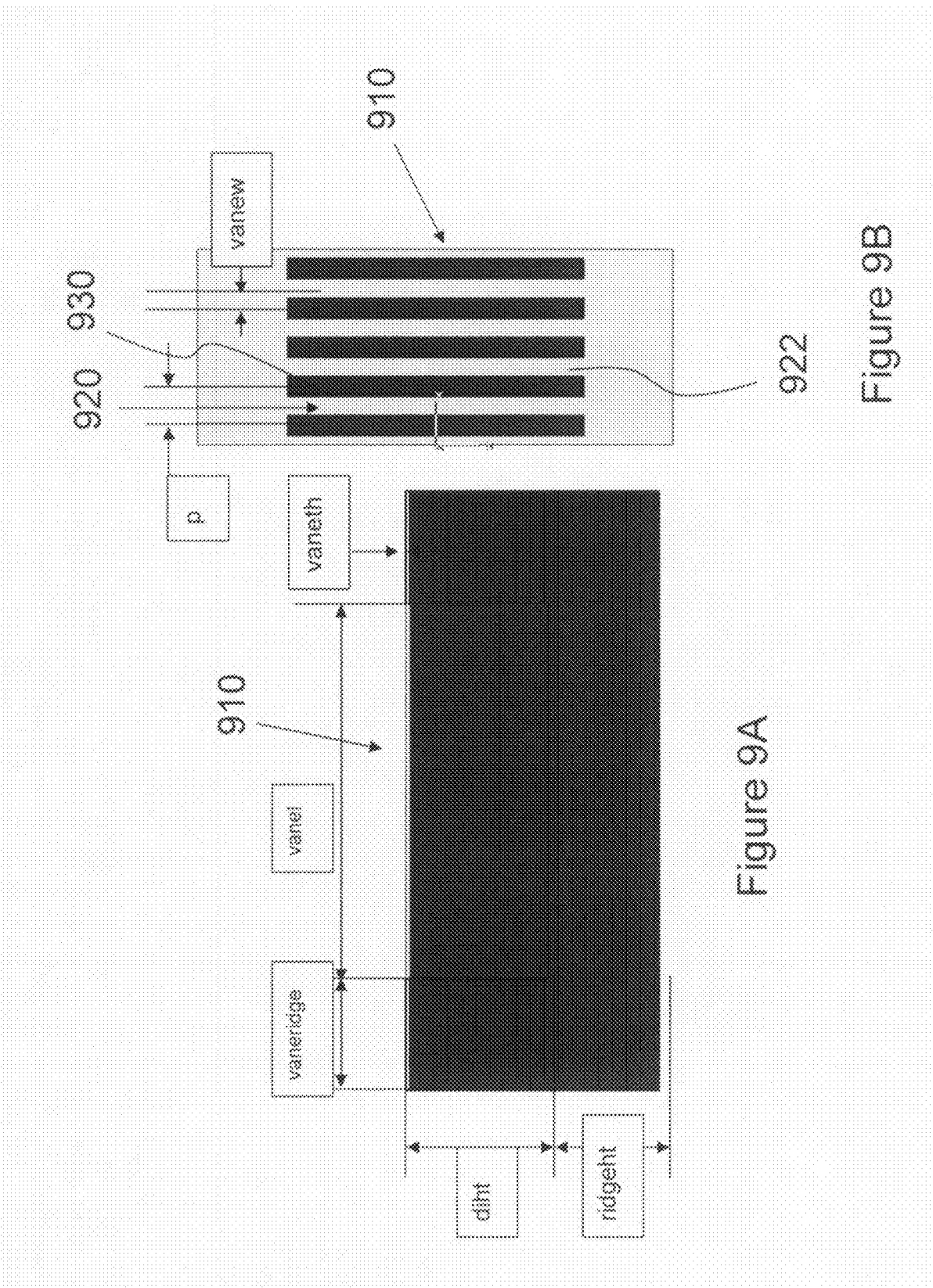

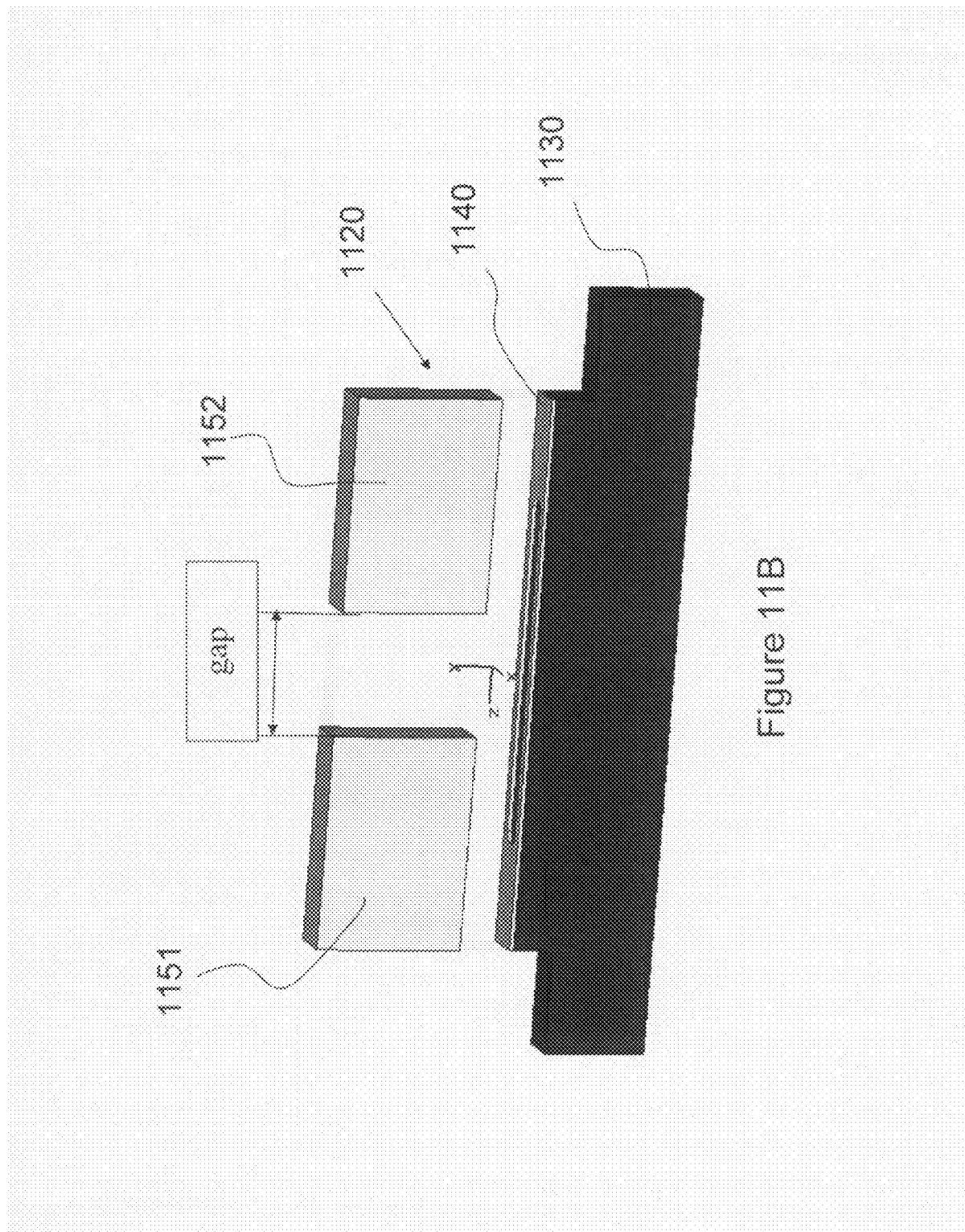

APPARATUS AND METHOD FOR PRODUCING ELECTROMAGNETIC OSCILLATIONS

RELATED APPLICATIONS

The instant application is related to U.S. application Ser. No. 10,916,467, filed Aug. 12, 2003, now U.S. Pat. No. 7,193,485, entitled "Method and Apparatus for Bi-Planar Backward Wave Oscillator," by the inventor named herein, the entirety of which is incorporated herein by reference. The instant application is related to U.S. application Ser. No. 10/772,444, filed Feb. 6, 2003, entitled "Free-Standing Diamond Structures and Methods," by G. Mearini and the inventor named herein, the entirety of which is incorporated herein by reference.

BACKGROUND

A backward wave oscillator ("BWO") is a tunable source of coherent radiation. A conventional BWO typically includes a slow wave circuit or structure having an electron source and suitable steering magnets or electric fields arranged around the slow wave circuit to pass an electron beam in proximity to the slow wave circuit or structure. In a conventional BWO, an electron beam interacts with the evanescent form of a propagating electromagnetic wave to oscillate the energy of the electromagnetic wave. Because of their wide tuning range, BWOs have been used in a variety of applications including as local oscillators in heterodyne receivers and transmitters.

A traveling wave tube ("TWT") is generally used to provide microwave, millimeter wave, sub-millimeter wave, etc. amplification. A conventional TWT typically includes a slow wave circuit or structure defined by a generally hollow vacuum-tight barrel with optional additional microwave circuitry disposed inside the barrel. An electron source and suitable steering magnets or electric fields are arranged around the slow wave circuit to pass an electron beam through the generally hollow beam tunnel. In a conventional TWT, an electron beam interacts with a propagating electromagnetic wave to amplify the energy of the electromagnetic wave. This interaction may be achieved by propagating the electromagnetic wave through a structure which slows the axial propagation of the electromagnetic wave and brings it into synchronism with the velocity of the electron beam. The kinetic energy in the electron beam is coupled into the electromagnetic wave, thereby amplifying the electromagnetic wave.

Nominally, the sub-millimeter wave regime ranges from 300 to 3000 GHz where electromagnetic radiation has a wavelength between 1.0 and 0.1 mm. Above the sub-millimeter band is the infrared region where wavelengths are typically reported in microns and the electromagnetic waves behave similar to light waves. Below the sub-millimeter is the millimeter wave band (ranging from 30 to 300 GHz) and the microwave band (ranging from 1 to 30 GHz). In the millimeter and microwave bands, the electromagnetic waves behave similar to the ordinary low frequency electric currents and voltages with the very important distinction that the circuit dimensions are comparable to a wavelength. In the sub-millimeter band, electromagnetic radiation has the properties of both microwaves and light. Structures that are suitable for microwaves become unreasonably small for sub-millimeter devices while standard optical configurations become far too large.

Added to the dimensional complexity are several physical constraints in the sub-millimeter band imposed by significant atmospheric attenuation and by greatly increased electrical conduction losses. Atmospheric attenuation is greatly enhanced by the presence of vibrational and rotational resonances of naturally occurring molecular gasses, while the roughness of metal surfaces significantly increases conduction losses. Because many of the issues regarding size and losses become exceedingly important at frequencies well below 300 GHz, the sub-millimeter regime is frequently extended to 100 GHz.

Conventionally, vacuum electron devices have dominated the microwave and millimeter wave regimes for applications where power and efficiency are important system parameters. However, within the sub-millimeter regime, conventional microwave structures are usually not applicable. Solid state devices are used as low power signal sources in the microwave and low millimeter wave regimes, but are not applicable in the sub-millimeter band. Gas lasers may be operated in the sub-millimeter band but may only be tuned to discrete frequencies and they are generally very large devices. Presently, there is no commercially available electronically tunable signal source in the sub-millimeter band.

Additionally, in conventional practice, when BWOs and TWTs are utilized together, the structures are fabricated as separate devices. Since two separate devices are commonly used, significant losses are associated with signals passing through a corresponding BWO output coupler, TWT input coupler, connecting transmission lines and the applicable two vacuum windows, which in total approximates to losses of 10 dB. For example, if the signal output from a conventional BWO is degraded by an insertion loss of 10 dB, a corresponding TWT must provide a compensating gain of 10 dB in addition to the system requirements. As a result the TWT design and fabrication must be complicated significantly by adding a sever to prevent the amplifier from oscillating uncontrollably. Thus, a need exists in the art to reduce insertion losses in coupling between an oscillator and amplifier in vacuum electron devices.

There is also a need for a novel source of electromagnetic radiation obtained by combining a BWO and a TWT amplifier in the same vacuum envelope. There is also a need in the art for a novel method of fabrication of two slow wave circuits as a unit on the same substrate. Thus, embodiments utilizing such novel methods and structure may provide significant advantages over conventional methods and circuits present in the art such as, but not limited to, improved manufacturing economies, reduction of insertion loss oscillator-amplifier couplings, and providing output powers of several hundred mW with efficiencies of a few percent.

Accordingly, there is a need for a novel apparatus and method for providing electromagnetic oscillations. Therefore, an embodiment of the present subject matter provides a device for providing electromagnetic oscillations comprising one or more electron beam generators for providing a first and a second electron beam and one or more magnetic field generators for focusing the first and second electron beams. The device may further comprise an oscillator comprising a slow wave circuit having a structure of an electrically non-conducting material with metallized surfaces adjacent the first electron beam, and an amplifier comprising a slow wave circuit having a structure of an electrically non-conducting material with metallized surfaces adjacent the second electron beam and electrically connected to the oscillator where the oscillator and amplifier are contained in a single vacuum envelope.

Another embodiment of the present subject matter provides a device for producing electromagnetic oscillations comprising a single vacuum envelope and a pair of electron beam generators contained within the envelope for generating a pair of substantially parallel electron beams. A pair of side-by-side slow wave circuits may be contained within the envelope, one circuit being positioned so that one electron beam induces electromagnetic oscillations in the circuit. The other circuit may be positioned to receive the electromagnetic oscillations, and positioned so that the other electron beam amplifies the electromagnetic oscillations in said circuit.

An additional embodiment of the present subject matter provides a device for providing electromagnetic oscillations at a sub-millimeter wavelength comprising a first and a second electron beam generator for generating a first and a second electron beam, each of the electron beam generators comprising a source of electrons, a collector of electrons, and a means for accelerating electrons emitted from the source in the direction of the collector. The device may further comprise an oscillator comprising a first slow wave circuit disposed intermediate the source and collector of the first electron beam generator where the first electron beam passes in sufficient proximity to the first slow wave circuit to induce electromagnetic oscillations in the first slow wave circuit and to interact with the induced oscillations for providing electromagnetic oscillations. An amplifier may also be included in the device, the amplifier comprising a second slow wave circuit positioned to receive the electromagnetic oscillations from the first slow wave circuit where the second electron beam passes in sufficient proximity to the second slow wave circuit to amplify the electromagnetic oscillations. Of course, the two slow wave circuits and beam generators may be contained in a single vacuum envelope.

Yet another embodiment of the present subject matter may provide a device for providing electromagnetic oscillations comprising one or more electron beam generators for providing a first and a second electron beam, an oscillator comprising a slow wave circuit having a structure of an electrically non-conducting material with metallized surfaces adjacent the first electron beam, and an amplifier comprising a second slow wave circuit having a structure of an electrically non-conducting material with metallized surfaces adjacent the second electron beam. In this exemplary embodiment, the first and second slow wave circuits may be fabricated on a single substrate using a chemical vapor deposition process.

Yet an additional embodiment of the present subject matter may provide a device for providing electromagnetic oscillations comprising one or more electron beam generators for providing a first and a second electron beam and one or more magnetic field generators for focusing the first and second electron beams. A first slow wave circuit may be provided for guiding electromagnetic oscillations having a first periodic structure of electrically non-conducting material with metallized surfaces adjacent the first electron beam. A second slow wave circuit may also be provided for guiding said electromagnetic oscillations having a second periodic structure of electrically non-conducting material with metallized surfaces adjacent the second electron beam. In one embodiment, the phase shift of the electromagnetic oscillations per period propagating in the second periodic structure may be different than the phase shift of the electromagnetic oscillations per period propagating in the first periodic structure.

One embodiment of the present subject matter provides a device for providing electromagnetic oscillations comprising a first and a second electron beam generator for providing a first and a second electron beam, each electron beam generator comprising a source of electrons, a collector of electrons, and means for accelerating electrons emitted from the source in the direction of the collector. The device may further include a first slow wave circuit disposed intermediate the source and collector of the first electron beam generator where the first electron beam passes in sufficient proximity to the first slow wave circuit to induce electromagnetic oscillations in the first slow wave circuit and to interact with the induced oscillations for providing electromagnetic oscillations. The first slow wave circuit may be defined in two planes where the first electron beam passing therebetween. The device may further comprise a second slow wave circuit positioned to receive electromagnetic oscillations from the first slow wave circuit where the second electron beam passes in sufficient proximity to the second slow wave circuit to amplify the electromagnetic oscillations propagating in the second slow wave circuit.

Another embodiment of the present subject matter provides a device for providing electromagnetic oscillations comprising a first and a second electron beam generator for providing a first and a second electron beam. The electron beam generators may each comprise a source of electrons, a collector of electrons, and means for accelerating electrons emitted from the source in the direction of the collector. A first slow wave circuit may be disposed intermediate the source and collector of the first electron beam generator where the first electron beam passes in sufficient proximity to the first slow wave circuit to induce electromagnetic oscillations in the first slow wave circuit and to interact with the induced oscillations for providing electromagnetic oscillations. A second slow wave circuit may be positioned intermediate the source and collector of the second electron beam generator and receives electromagnetic oscillations from the first slow wave circuit where the second electron beam passes in sufficient proximity to the second slow wave circuit to amplify the electromagnetic oscillations in the second slow wave circuit. In this embodiment the first electron beam interacts with the full propagation strength of the electromagnetic oscillations propagating in the first slow wave circuit. In an alternative embodiment, the second electron beam interacts with the full propagation strength of the electromagnetic oscillations propagating in the second slow wave circuit.

One embodiment of the present subject matter may provide a device forming a pair of side-by-side slow wave circuits comprising a first substantially planar plate containing a pair of side-by-side periodic structures of electrically non-conducting material. Each of the structures may comprise an elongated ridge having a plurality of spaced digits extending substantially perpendicular therefrom with selected surfaces of the ridges and digits being metallized. A second substantially planar plate may be provided containing a pair of side-by-side periodic structures of electrically non-conducting material. Each of these structures may comprise an elongated ridge having a plurality of spaced digits extending substantially perpendicular therefrom with selected surfaces of the ridges and digits being metallized. The second plate may be positioned spaced from and substantially parallel to the first plate so that each periodic structure on the second plate opposes a periodic structure on the first plate forming a pair of biplanar, interdigital slow wave circuits.

An embodiment of the present subject matter may provide a device forming a pair of side-by-side slow wave circuits comprising a first substantially planar plate containing a pair of side-by-side periodic structures of electrically non-conducting material. A first of the structures may comprise an elongated ridge having a plurality of spaced digits extending substantially perpendicular therefrom with selected surfaces of the ridges and digits being metallized. A second of the structures may comprise a pair of laterally spaced substantially parallel elongated ridges having a plurality of spaced vanes extending substantially perpendicular therebetween.

The device may further include a second substantially planar plate containing a pair of side-by-side structures of electrically non-conducting material where a first of the structures is a periodic structure comprising an elongated ridge having a plurality of spaced digits extending substantially perpendicular therefrom with selected surfaces of the ridges and digits being metallized and a second of the structures comprising a substantially planar surface. In one embodiment the second plate may be positioned spaced from and substantially parallel to the first plate so that the periodic structure on the second plate opposes the first periodic structure on the first plate forming a biplanar, interdigital slow wave circuit. Further, the substantially planar surface on the second plate may also oppose the second periodic structure forming a single ladder slow wave circuit.

A further embodiment of the present subject matter may provide a device for providing electromagnetic oscillations having a sub-millimeter wavelength comprising a vacuum envelope and a pair of electron beam generators contained in the vacuum envelope. Each of the electron beam generators may include a source of electrons, a collector of electrons, and a means for accelerating electrons emitted from the source in the direction of the collector for generating a pair of substantially parallel electron beams at substantially the same voltage. The device may further comprise one or more magnetic field generators for focusing the electron beams and a pair of side-by-side slow wave circuits. Each slow wave circuit may comprise a periodic structure of diamond having selected surfaces overlaid with gold, each of the slow wave circuits being positioned between the source and collector of a respective electron beam generator so that the gold overlaid surfaces are adjacent the respective electron beam. The periodic structure of each slow wave circuit may be selected so that one slow wave circuit operates as a backward wave oscillator which feeds the electromagnetic oscillations induced therein into the other slow wave circuit which operates as an amplifier.

These embodiments and many other objects and advantages thereof will be readily apparent to one skilled in the art to which the invention pertains from a perusal of the claims, the appended drawings, and the following detailed description of the embodiments.

BRIEF DESCRIPTION OF THE DRAWINGS

FIGS. 9A and 9B are schematic representations of a ladder circuit according to an embodiment of the present subject matter;

FIGS. 11A and 11B are schematic representations of ladder circuits according to additional embodiments of the present subject matter;

DETAILED DESCRIPTION

Figure 1:
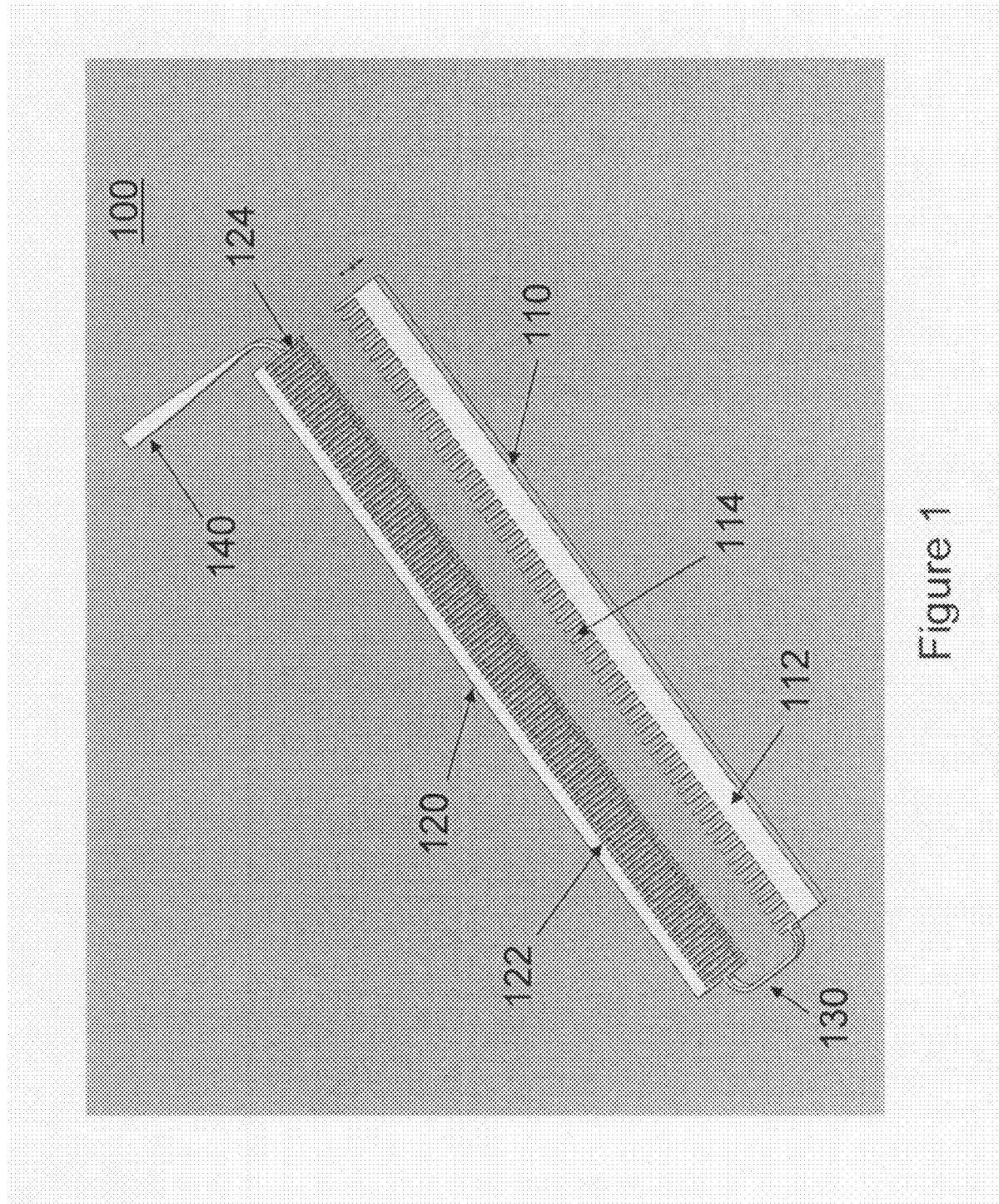
FIG. 1 is a schematic representation of one embodiment of the present subject matter.

FIG. 1 is a schematic representation of one embodiment of the present subject matter. With reference to FIG. 1, one plane of a pair of bi-planar slow wave circuits 100 is illustrated having an oscillating circuit 110 and an amplifying circuit 120 operatively connected by a coupling member 130. The amplifying circuit 120 accepts an output from the oscillating circuit 110 via the coupling member 130. The oscillating circuit 110 may be a slow wave circuit such as a Backward Wave Oscillator ("BWO") or an oscillating circuit commonly utilized in the art. One exemplary BWO is disclosed in U.S. Pat. No. 7,193,485, entitled, "Method and Apparatus for Bi-Planar Backward Wave Oscillator," by the present named inventor, the entirety of which is incorporated herein by reference. The slow wave circuit 100 shown represents one half of an entire device.

While not shown, a cold cathode emitter may be positioned at one end of the oscillator 110 while a collector is positioned at the opposite end. Using a cold cathode source such as Spindt-type, field emission cathodes are optional and other electron emitting sources may be used without departing from the principles of the disclosure. Conventional means may be utilized for coupling the electron source (e.g., electron gun) to the oscillator 110. For example, the electron source may be coupled to the oscillator using a mechanical means or the entire electron source and oscillator may be fabricated as one structure, eliminating problems of alignment. A second electron source (not shown) may also be positioned at one end of the amplifier 120 while a collector is positioned at an opposite end.

The oscillator 110 may be provided as a bi-planar interdigital structure having electrically conductive surfaces 112 that are periodic in a beam propagation direction. The amplifier 120 may also be provided as a bi-planar interdigital structure having electrically conductive surfaces 122 that are periodic in a beam propagation direction and operated at a different phase shift per period than the oscillator. For example, to achieve a predetermined oscillated electromagnetic signal, an amplifier may be operated at a different phase shift per period than the phase shift per period of the respective oscillator or BWO. This may be achieved, among others, by operating the respective electron sources of the amplifier and oscillator at the same voltage and providing two different slow wave circuit structures or may also be achieved by operating the respective electron sources of the amplifier and oscillator at different voltages and providing slow wave circuit structures that are substantially similar. Alternative amplifier embodiments may include a traveling wave tube ("TWT"), a single diamond supported ladder, a Karp-loaded single diamond supported ladder, and an anti-Karp loaded single diamond supported ladder. Exemplary coupling members 130 may be coupling lines, transmission lines, waveguide, and the like. The amplifier 120 may be operatively connected to an output mechanism 140 such as a waveguide, an antenna or may be coupled to some known entry element for a transmission system. The oscillator 110, amplifier 120, and coupling member 130 and/or output mechanism 140 may be fabricated as a single unit on one wafer.

The slow wave circuit 100 is shown as an integrated unit with fingers 114, 124 protruding toward the center of the circuit. In one embodiment, the slow wave circuit 100 may be fabricated as complementary halves prior to alignment and/or assembly. The body of the slow wave circuit 100 may be fabricated from a material of exceptional thermal conductivity. Exemplary materials include but are not limited to synthetic diamond. Synthetic diamond is suitable as it provides high thermal conductivity enabling efficient heat transmission and possesses a high dielectric strength to withstand electron source voltages and very a low loss tangent to minimize RF losses. To improve performance, certain surfaces of the circuit may be coated with electro-conductive material such as gold, silver, platinum, chromium, copper or a composite thereof. An optional coating layer may be interposed between the diamond structure and the conductive coating (e.g., Ag, Cr or Mo). The coating layer may be provided to enhance the bonding between gold and the diamond structure.

For example, one embodiment of the present subject matter may provide a device having one or more electron beam generators for providing a first and a second electron beam and one or more magnetic field generators for focusing the first and second electron beams. An oscillator having a structure of an electrically non-conducting material with metallized surfaces adjacent the first electron beam and an amplifier having a structure of an electrically non-conducting material with metallized surfaces adjacent the second electron beam may be provided where the amplifier is electrically connected to the oscillator. In an alternative embodiment both the oscillator and amplifier are contained in a single vacuum envelope. The amplifier and oscillator may be positioned side-by-side such that one electron beam induces electromagnetic oscillations in oscillator and a second electron beam amplifies the electromagnetic oscillations in the amplifier. Of course, the amplifier and/or oscillator may be slow wave circuits formed from traveling wave tubes, ladder circuit, backward wave oscillators and the like.

An alternative embodiment of the present subject matter may include a pair of side-by-side slow wave circuits comprising a first substantially planar plate containing a pair of side-by-side periodic structures of electrically non-conducting material. Each of the structures may comprise an elongated ridge having a plurality of spaced digits extending substantially perpendicular therefrom with selected surfaces of the ridges and digits being metallized. A second substantially planar plate may also be provided containing a pair of side-by-side periodic structures of electrically non-conducting material. Each of these structures may comprise an elongated ridge having a plurality of spaced digits extending substantially perpendicular therefrom with selected surfaces of the ridges and digits being metallized. The second plate may be positioned spaced from and substantially parallel to the first plate so that each periodic structure on the second plate opposes a periodic structure on the first plate forming a pair of biplanar, interdigital slow wave circuits.

Figure 2:
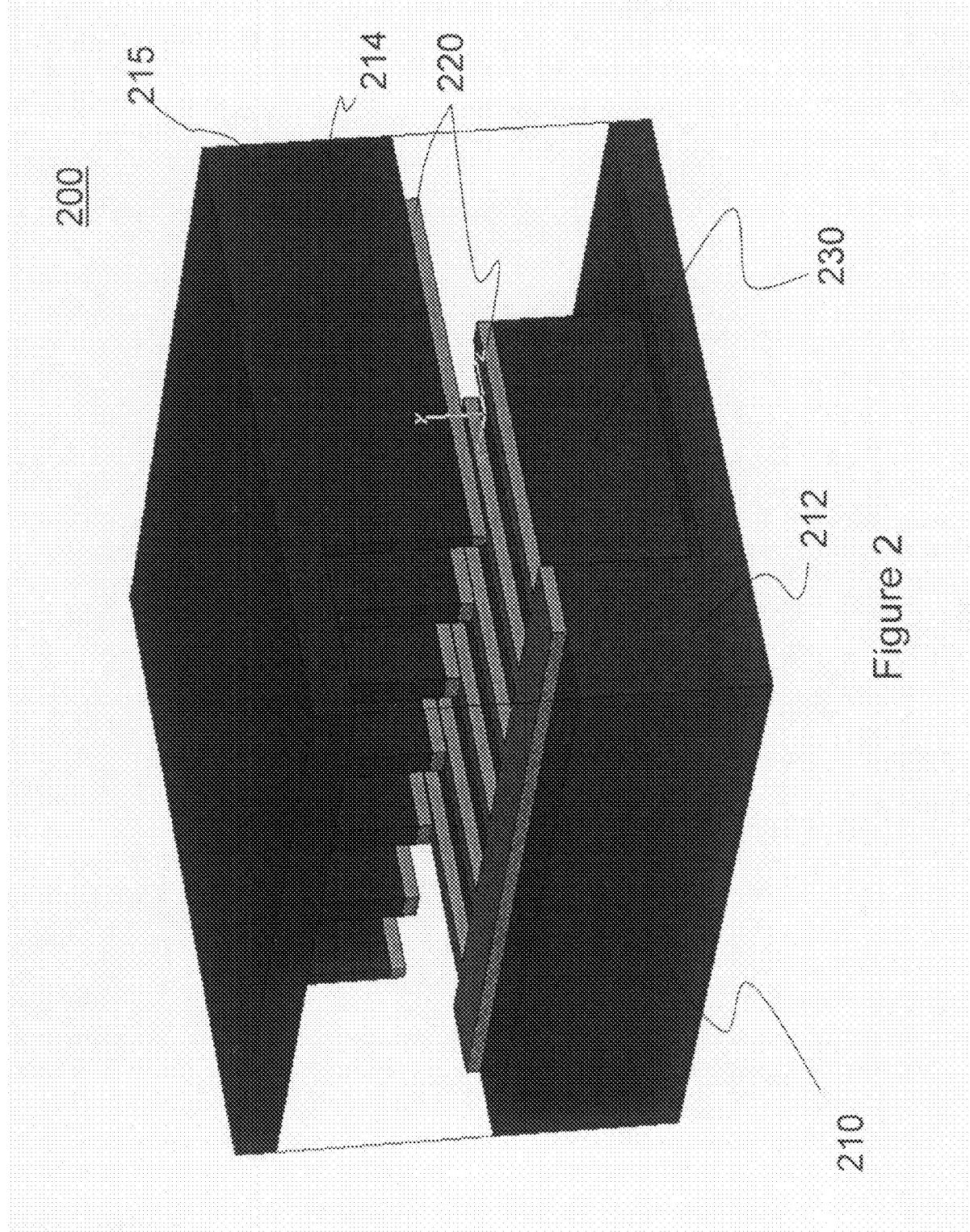
FIG. 2 is a schematic illustration of a three dimensional view of a bi-planar interdigital circuit according to one embodiment of the present subject matter.

FIG. 2 is a schematic illustration of a three dimensional view of a bi-planar interdigital circuit according to one embodiment of the present subject matter. With reference to FIG. 2, a bi-planar interdigital circuit 200 is shown to include a first plate 210 and a second plate 215. In one embodiment, each plate of the bi-planar interdigital circuit comprises diamond. Also shown in FIG. 2 is conductive coating 220 deposited on portions of the ridges 212, 214 and on the digits 230 of the interdigital circuit 200. While various coating compositions may be utilized for embodiments of the present subject matter, exemplary coatings may be, but are not limited to gold, silver, platinum, copper, chromium or a composite thereof. A bi-planar interdigital circuit 200 according to embodiments of the present subject provides a distinct advantage over other conventional planar circuits that are fabricated lithographically. For example, in the bi-planar interdigital circuit 200, the electromagnetic wave propagates in the space between the two plates 210, 215. Therefore, an electron beam passing between these plates interacts with the full propagation strength of the electromagnetic wave propagating therein. In conventional circuits formed in a single plane, the electron beam must interact with an evanescent wave that decays exponentially above the planar surface. By way of example, one embodiment of the present subject matter may provide one or more electron beam generators for providing a first and a second electron beam, an oscillator comprising a slow wave circuit having a structure of an electrically non-conducting material with metallized surfaces adjacent the first electron beam, and an amplifier comprising a second slow wave circuit having a structure of an electrically non-conducting material with metallized surfaces adjacent the second electron beam. In this exemplary embodiment, the first and second slow wave circuits may be fabricated on a single substrate using a chemical vapor deposition process. The electron beams may thus interact with the full propagation strength of the electromagnetic oscillations propagating in the first and second slow wave circuits.

Figure 3B:
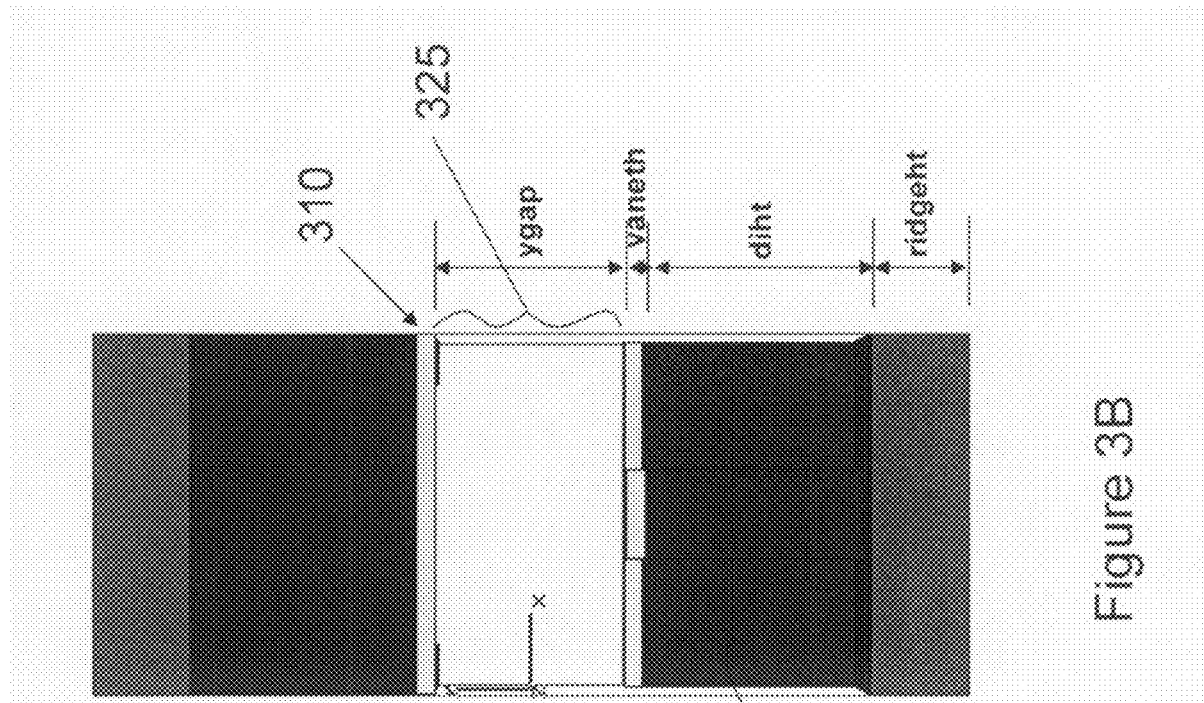
FIGS. 3A and 3B are schematic representations of a backward wave oscillator according to an embodiment of the present subject matter.
Figure 3A:
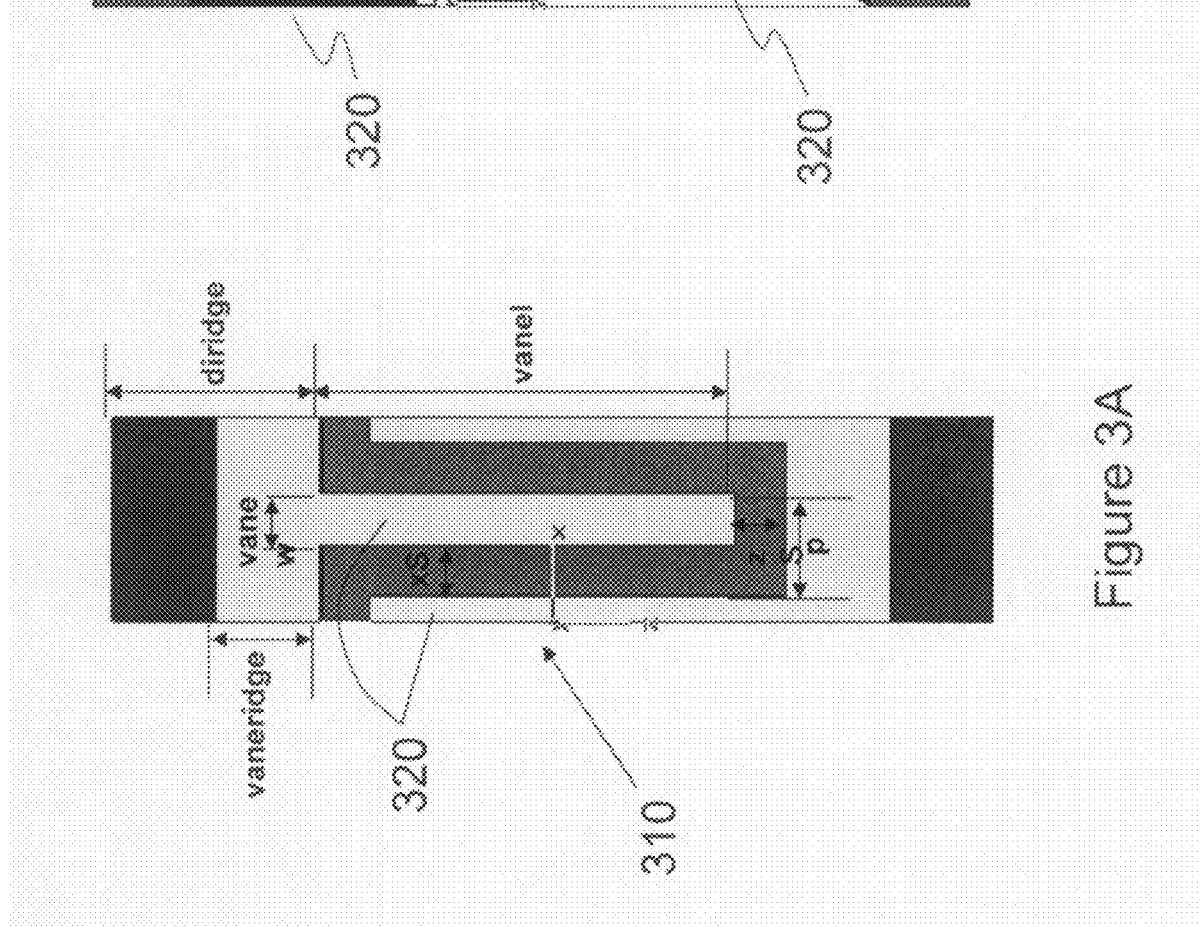

FIGS. 3A and 3B are schematic representations of a BWO according to an embodiment of the present subject matter. With reference to FIGS. 3A and 3B, a schematic of the circuit that defines exemplary device dimensions is shown, and a set of preliminary dimensions utilized during a parameter study of a 650 GHz slow wave circuit are listed below in Table 1; however, such a listing, frequency and illustration are exemplary only and should not in any way limit the scope of the claims appended herewith. With reference to FIGS. 3A and 3B, a bi-planar interdigital circuit 310 is illustrated having a periodic geometric structure of synthetic diamond with the surfaces adjacent a beam being overlaid by electro-conductive material such as gold. The interdigital structure may include plural sets of digits 320 each set in a different plane separated by a predetermined distance 325 whereby an electron beam passing between the two planes interacts with the full propagation strength of electromagnetic energy induced in the interdigital circuit 310.

TABLE 1

650 GHz Dimensions (microns) for an Optimized
Bi-planar Interdigital Circuit

| Parameter | Dimensions |
|---|---|
| P | 10.9 |
| Vanew | 7.3 |
| Diht | 20.0 |
| XS | 3.6 |
| ZS | 3.6 |
| Vanel | 89.3 |
| Diridge | 100 |
| Vaneth | 2.0 |
| Vaneridge | 100 |
| Ridgeht | 15.0 |
| Ygap | 25.0 |

Figure 4:
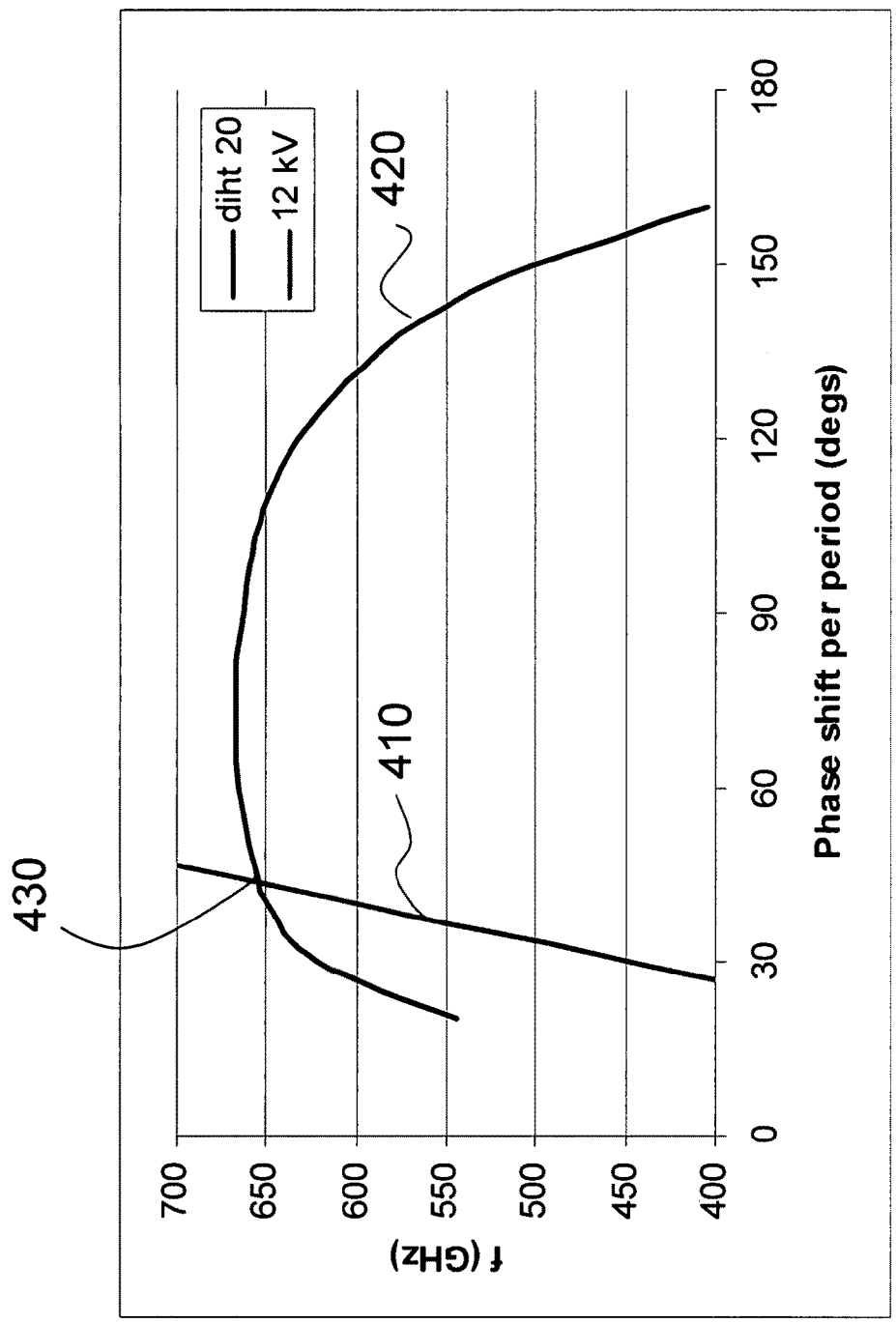
FIG. 4 is a graph showing a dispersion relation ($\omega$-$\beta$ diagram) for a circuit according to an embodiment of the present subject matter.
Figure 5:
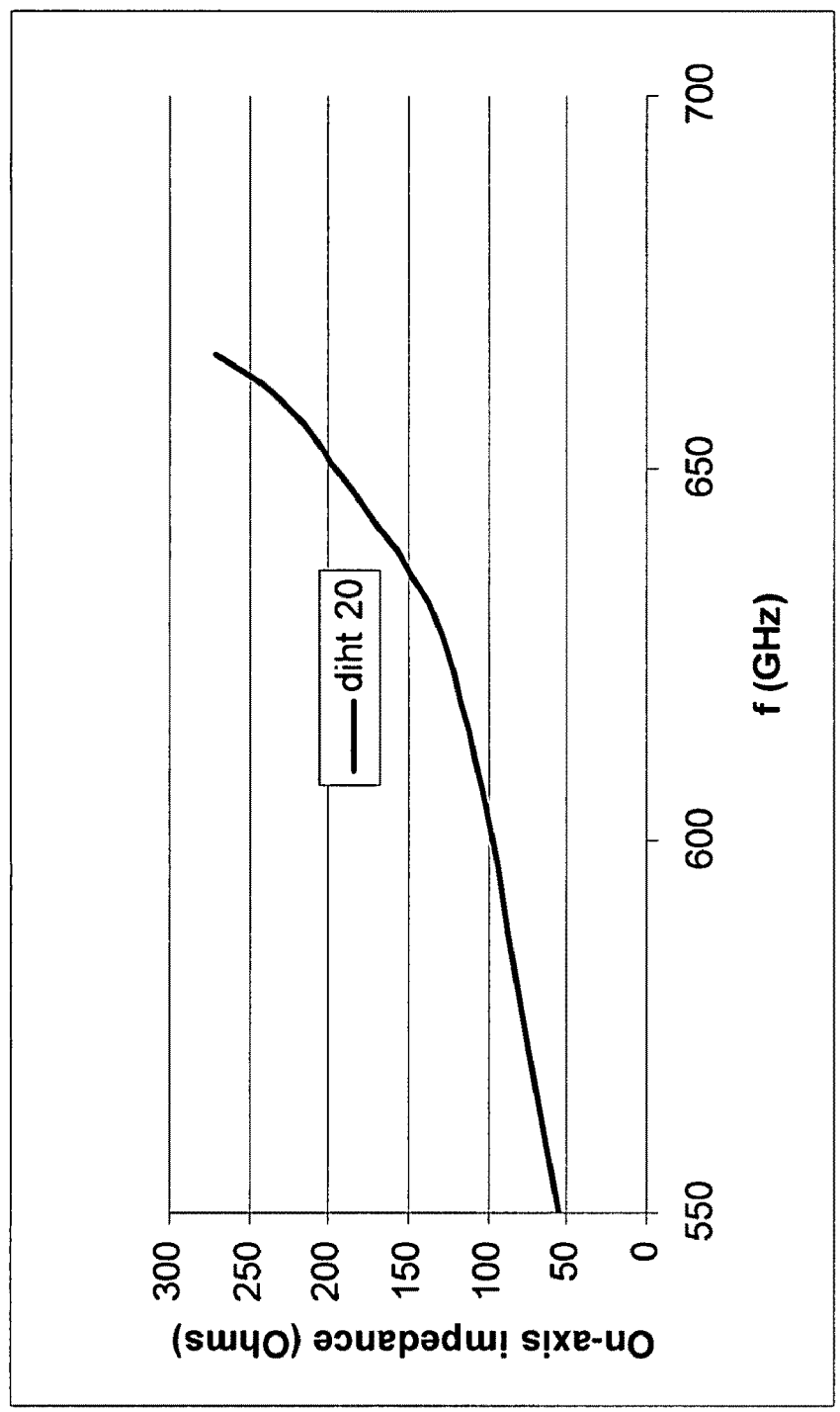
FIG. 5 is a graph showing the on-axis impedance for a circuit according to an embodiment of the present subject matter.
Figure 6:
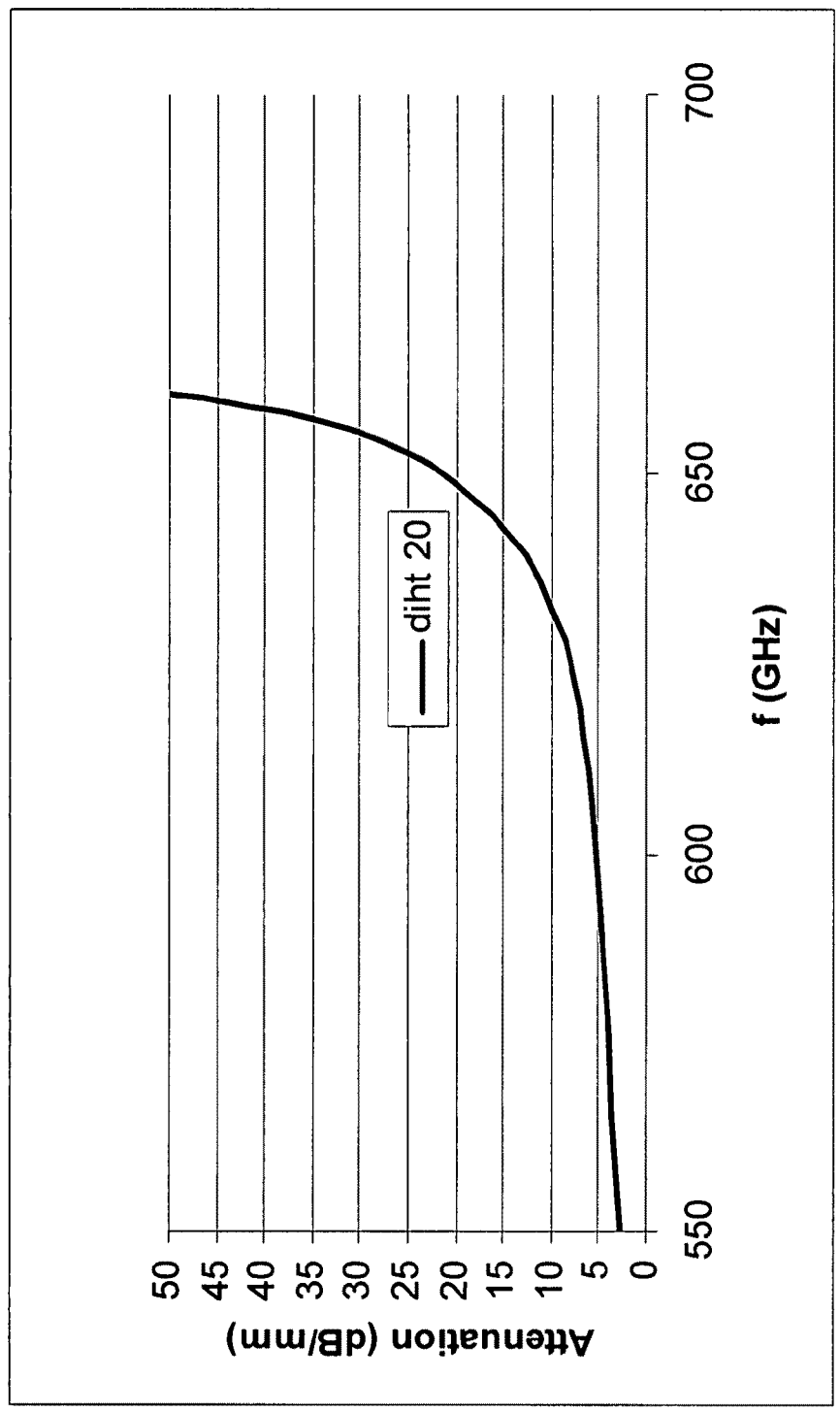
FIG. 6 is a graph showing the attenuation for a circuit according to an embodiment of the present subject matter.

The dispersion, on-axis interaction impedance and attenuation were computed for each of the parameters of the bi-planar interdigital circuit listed in Table 1. FIG. 4 is a graph showing a dispersion relation ($\omega$-$\beta$ diagram) for a circuit according to an embodiment of the present subject matter. The on-axis interaction impedance and the attenuation relations are shown in FIGS. 5 and 6, respectively. With reference to FIG. 4, for an electron beam voltage of 12 kV an operating point is selected in the vicinity of BL=40 degrees per period. The phase velocity of a 12 kV electron beam is represented by line 410 and the frequency per phase shift per period of an interdigital circuit having a diamond height (diht) of 20 is represented by line 420. The intersection of these two lines defines the operating point 430 of a circuit according to one embodiment of the present subject matter. For example, a device comprising one or more electron beam generators may provide a first and a second electron beam and one or more magnetic field generators for focusing the first and second electron beams. A first slow wave circuit may be provided for guiding electromagnetic oscillations having a first periodic structure of electrically non-conducting material with metallized surfaces adjacent the first electron beam and thus a first operating point. A second slow wave circuit may also be provided for guiding said electromagnetic oscillations having a second periodic structure of electrically non-conducting material with metallized surfaces adjacent the second electron beam and thus a second operating point. In one embodiment, the phase shift of the electromagnetic oscillations per period propagating in the second periodic structure may be different than the phase shift of the electromagnetic oscillations per period propagating in the first periodic structure.

On-axis interaction impedance strongly influences gain and efficiency. However, a relatively high impedance may be accompanied by a high attenuation. For example, FIG. 5 is a graph showing the on-axis impedance for a circuit according to an embodiment of the present subject matter. As shown in FIG. 5, for a diamond height of 20 (see FIGS. 3A and 3B) impedance increases as frequency increases. The effective impedance is also sensitive to the beam dimensions and may increase as the fields are averaged over the real height of the electron beam and decrease as the width of the beam is taken into account. Thus, while the value of the impedance is much higher than other possible sub-millimeter circuits, the attenuation, as seen in FIG. 6, is also high. FIG. 6 is a graph showing the attenuation for a circuit according to an embodiment of the present subject matter. As shown in FIG. 6, for a diht of 20 microns, attenuation also increases as frequency increases.

Figure 7:
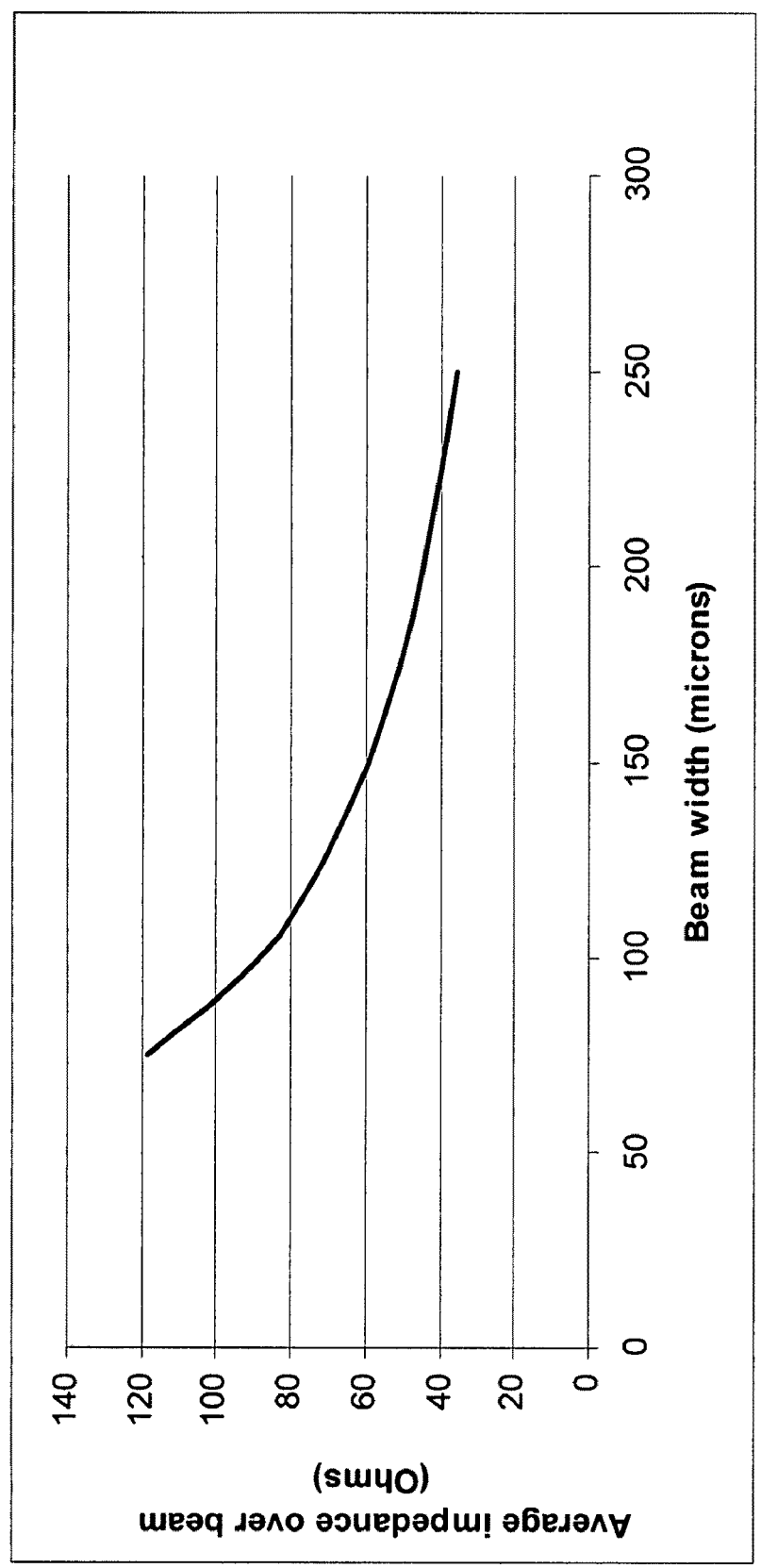
FIG. 7 is a graph showing beam averaged impedance versus beam width for a circuit according to an embodiment of the present subject matter.

To test the impact of high attenuation, a helical TWT interaction code may be utilized to obtain an estimate of RF efficiency, assuming a round beam with a radius sized to achieve an equal current density. FIG. 7 is a graph showing beam averaged impedance versus beam width for a circuit according to an embodiment of the present subject matter. With reference to FIG. 7, impedance values averaged over a beam with a 20 micron height as a function of beam width were plotted and an analysis of the predicted performance presented below in Table 2; however, such a listing and illustration are exemplary only and should not in any way limit the scope of the claims appended herewith.

TABLE 2

Predicted Performance of an Optimized Bi-planar
Interdigital Circuit as a Function of Beam Width

| atten (dB/mm) | 23 |
| Pin (mW) | 30 |
| V (V) | 12000 |
| 1.5 Brillouin (T) | 0.298 |
| Beam Height (μm) | 20 |

| Beam width (μm) | I (mA) | Kavg (Ohms) | Equiv. radius (μm) | Sat. length (mm) | Sat. gain (dB) | Sat. efficiency (%) | Sat. Power (W) |
|---|---|---|---|---|---|---|---|
| 250 | 10 | 35 | 39.89 | 9.99 | 13.5 | 0.56 | 0.6709 |
| 225 | 9 | 39 | 37.85 | 9.61 | 13.2 | 0.58 | 0.626 |
| 200 | 8 | 44 | 35.68 | 9.41 | 12.75 | 0.589 | 0.565 |
| 175 | 7 | 50 | 33.38 | 9.21 | 12.03 | 0.571 | 0.479 |
| 150 | 6 | 59 | 30.90 | 8.85 | 11.03 | 0.528 | 0.38 |
| 125 | 5 | 71 | 28.21 | 8.45 | 9.68 | 0.464 | 0.2787 |

Figure 8A:
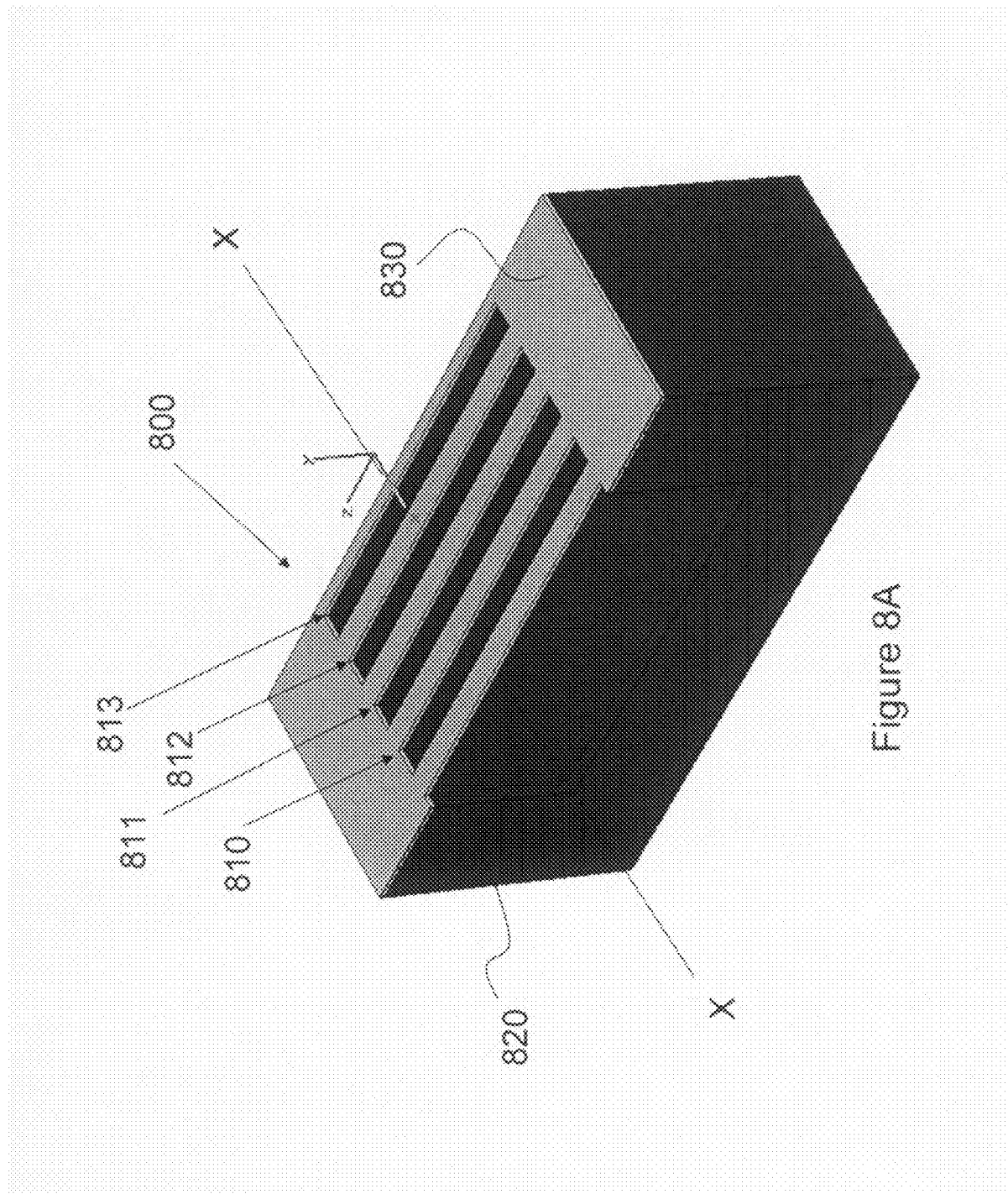
FIG. 8A is a schematic representation of a three dimensional view of a ladder circuit according to one embodiment of the present subject matter.
Figure 8B:
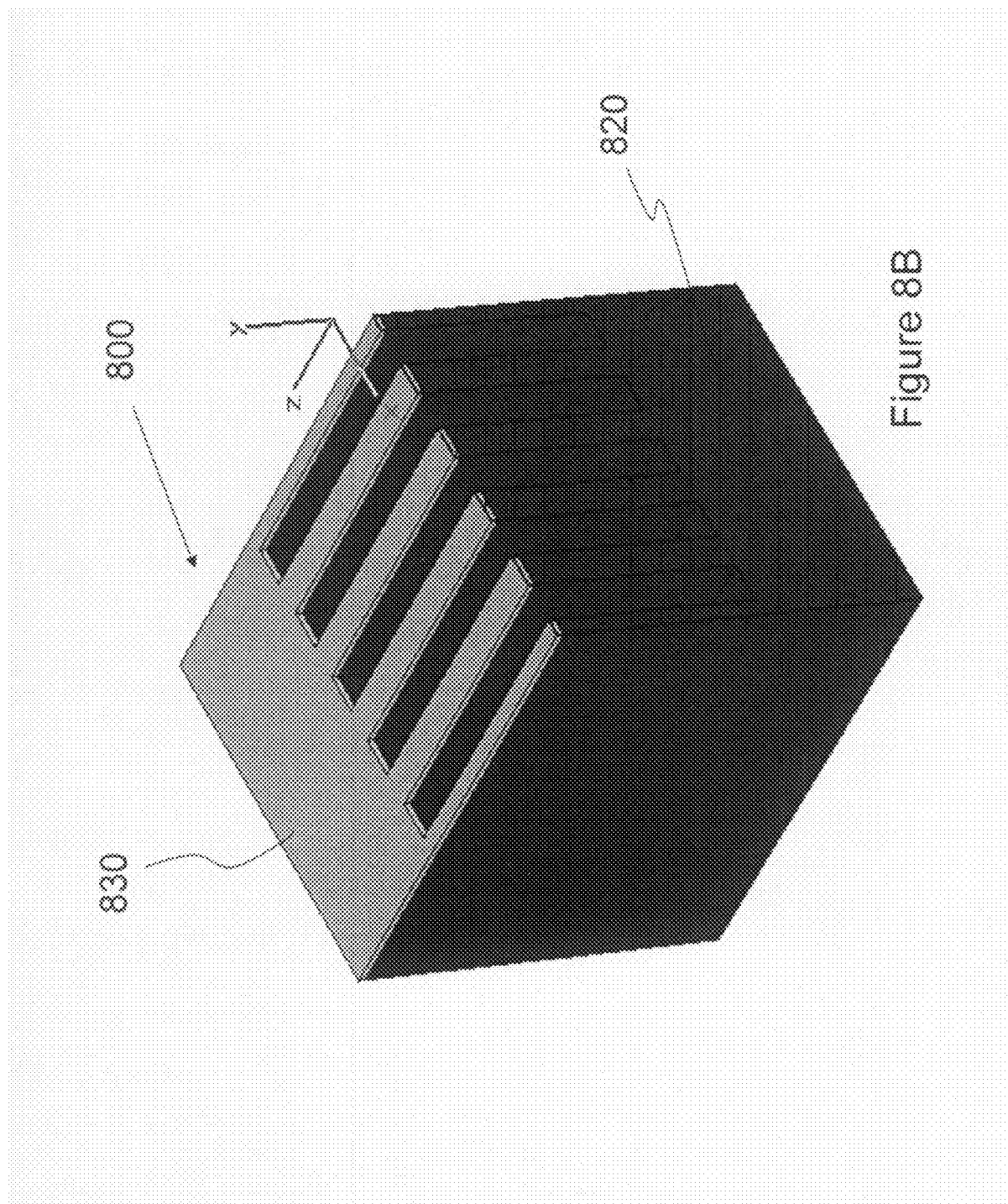
FIG. 8B is a cross-section of the ladder circuit of FIG. 8A at line X-X.

An alternative embodiment to the amplifier, e.g., bi-planar interdigital circuit, described with reference to FIG. 1 is a single diamond supported ladder circuit. FIG. 8A is a schematic representation of a three dimensional view of a single diamond supported ladder circuit according to one embodiment of the present subject matter. FIG. 8B is a cross-section of the ladder circuit of FIG. 8A at line X-X. With reference to FIG. 8A, a portion of an exemplary ladder circuit 800 is shown having four periods 810-813. Of course, any number of periods may be provided in ladder circuits according to embodiments of the present subject matter. The body 820 of the ladder circuit 800 may be fabricated from a material of exceptional thermal conductivity such as, but not limited to, synthetic diamond. Synthetic diamond is suitable as it provides high thermal conductivity enabling efficient heat transmission, possesses a high dielectric strength to withstand electron source voltages, and a very low loss tangent to minimize RF losses. Certain surfaces 830 of the ladder circuit may be coated with a layer of electro-conductive material such as gold, silver, platinum, chromium, copper or a composite thereof. Of course, an optional coating layer may be interposed between the diamond structure and the conductive coating (e.g., Ag, Cr or Mo) to enhance the bonding between gold and the diamond structure. The ladder circuit 800 may be enclosed in a bounding metal box with the top plane located a predetermined distance above the ladder circuit. Alternative embodiments of the ladder circuit may provide a second surface adjacent the top plane, located a predetermined distance thereabove, and comprising diamond or a metallized surface.

For example, an exemplary device according to one embodiment of the present subject matter may provide a pair of side-by-side slow wave circuits comprising a first substantially planar plate containing a pair of side-by-side periodic structures of electrically non-conducting material. A first of the structures may comprise an elongated ridge having a plurality of spaced digits extending substantially perpendicular therefrom with selected surfaces of the ridges and digits being metallized. A second of the structures may comprise a pair of laterally spaced substantially parallel elongated ridges having a plurality of spaced vanes extending substantially perpendicular therebetween. The device may further include a second substantially planar plate containing a pair of side-by-side structures of electrically non-conducting material where a first of the structures is a periodic structure comprising an elongated ridge having a plurality of spaced digits extending substantially perpendicular therefrom with selected surfaces of the ridges and digits being metallized and a second of the structures comprising a substantially planar surface. In one embodiment the second plate may be positioned spaced from and substantially parallel to the first plate so that the periodic structure on the second plate opposes the first periodic structure on the first plate forming a biplanar, interdigital slow wave circuit. Further, the substantially planar surface on the second plate may also oppose the second periodic structure forming a single ladder slow wave circuit.

FIGS. 9A and 9B are schematic representations of a ladder circuit according to an embodiment of the present subject matter. With reference to FIGS. 9A and 9B, a schematic of a ladder circuit that defines exemplary device dimensions is shown, and a set of preliminary dimensions utilized during a parameter study of the ladder circuit are listed below in Table 3; however, such a listing and illustrations are exemplary only and should not in any way limit the scope of the claims appended herewith. With reference to FIGS. 9A and 9B, a single diamond supported ladder circuit 910 is illustrated having a geometric structure of synthetic diamond with the surfaces adjacent a beam being overlaid by electro-conductive material such as gold. The ladder structure may include plural periods ("p") which comprise a rung or vane 920 and a gap or hole 930 in the synthetic diamond base and respective conductive material between an adjacent vane 922 whereby an electron beam passing over the ladder circuit 910 interacts with the electromagnetic energy induced in the ladder circuit 910. While four periods are illustrated in FIG. 9B it is to be noted that any number of periods may be provided in ladder circuits according to embodiments of the present subject matter. Of course, the strength of the electromagnetic energy may be varied by providing a second surface adjacent the top plane of the ladder circuit 910, located a predetermined distance thereabove, and comprising diamond or a metallized surface.

TABLE 3

Optimized (microns) Dimensions of Single Diamond Ladder Circuit

| Parameter | Dimensions |
|---|---|
| diht | 20 |
| vaneth | 2 |
| vanel | 167 |
| vanew | 10 |
| p | 21.8 |
| vaneridge | 50 |
| ridgeht | 50 |

Figure 10:
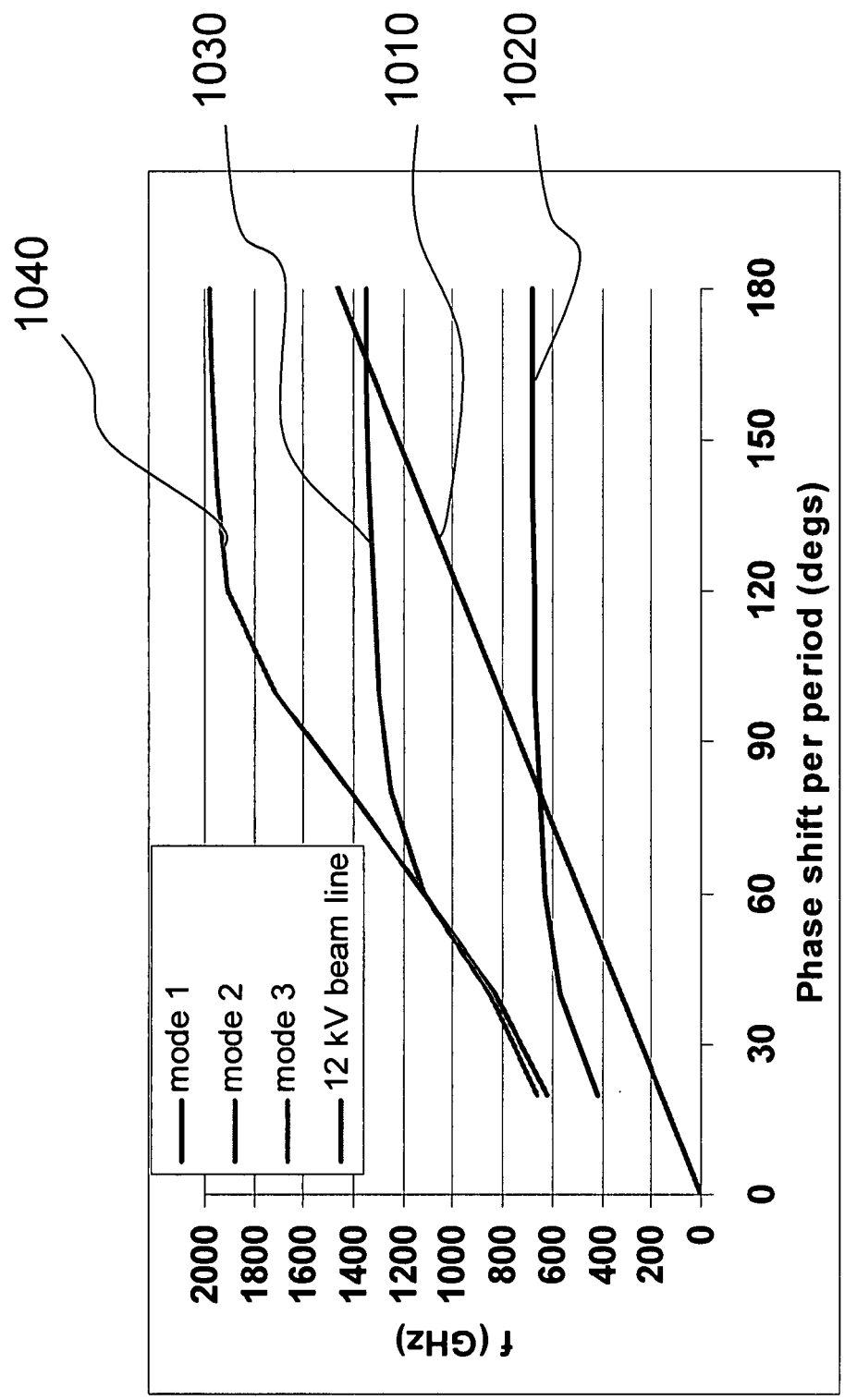
FIG. 10 is a graph showing a dispersion relation ($\omega$-$\beta$ diagram) for a circuit according to an embodiment of the present subject matter.

FIG. 10 is a graph showing a dispersion relation (ω-β diagram) for a diamond supported ladder circuit according to an embodiment of the present subject matter showing three modes of operation. With reference to FIG. 10, the dispersion was computed for each of the parameters listed in Table 3 for an electron beam having a voltage of 12 kV represented by phase velocity line 1010. A primary mode represented by line 1020 reflects the dispersion for the optimized set of circuit dimensions provided in Table 3. The secondary and tertiary modes are represented by lines 1030, 1040, respectively. As illustrated, for a 12 kV electron beam a ladder circuit in the primary mode 1020 would provide an operating point of approximately BL=80 and a ladder circuit in the secondary mode 1030 would provide an operating point of approximately BL=165. Simulations of the performance of this ladder circuit indicate that it would produce a saturated output power of approximately 500 mW.

Figure 11A:
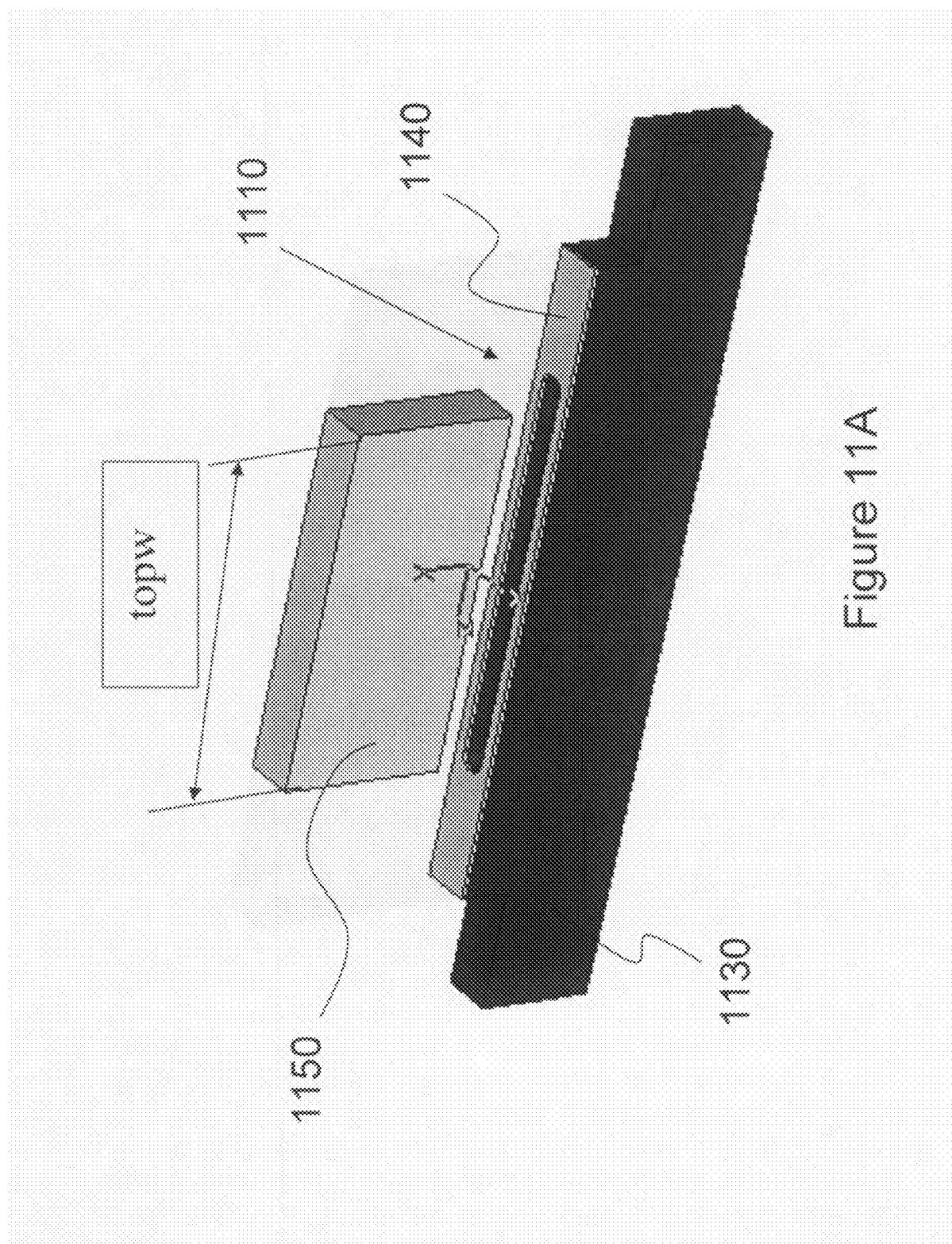

FIGS. 11A and 11B are schematic representations of ladder circuits according to additional embodiments of the present subject matter. The two configurations illustrated in FIGS. 11A and 11B provide a reduced attenuation. FIG. 11A illustrates a Karp loaded single diamond supported ladder circuit 1110, FIG. 11B illustrates an anti-Karp loaded single diamond supported ladder circuit 1120. The body 1130 of the ladder circuits 1110, 1120 may be fabricated from a material of exceptional thermal conductivity such as, but not limited to, synthetic diamond, and certain surfaces 1140 of the ladder circuits 1110, 1120 may be coated with a layer of electro-conductive material such as gold, silver, platinum, chromium, copper or a composite thereof. Of course, an optional coating layer may be interposed between the diamond structure and the conductive coating (e.g., Ag, Cr or Mo) to enhance the bonding between gold and the diamond structure. The Karp terminology is taken from ladder structures placed in single or double ridge waveguide as presented by Arthur Karp. See, e.g., A. Karp, "Traveling Wave Tube Experiments at Millimeter Wavelengths with a New, Easily Built, Space-Harmonic Circuit," Proc. I.R.E., Vol. 43, pp. 41-46 (1955). In one embodiment, the top plane of the Karp loaded circuit 1110 and anti-Karp loaded circuit 1120 comprises diamond. Facing the top plane of the circuits 1110, 1120 may be at least one metal ridge 1150, in the Karp loaded circuit 1110, and two metal ridges 1151, 1152 in the anti-Karp loaded circuit 1120. These ridges 1150-1152 may extend the entire dimension transverse to the vanes of the corresponding ladder circuit. Ridges in alternative embodiments of the present subject matter may terminate prior to or overlap the proximate and distal axial ends of the ladder circuit. Further ridge embodiments may also be periodic along the longitudinal length of the corresponding ladder circuit. In the bi-planar circuits 1110, 1120, the electromagnetic wave propagates in the space between the two planes. Therefore, an electron beam passing between these planes interacts with the strength of the electromagnetic wave.

To achieve an optimum performance, the dimensions, 'topw' and 'gap', were varied. Table 4 lists the simulated large signal performance for an exemplary Karp-loaded single diamond supported ladder circuit having a topw of 50, an anti-Karp loaded single diamond supported ladder circuit having a gap of 260, and a Karp loaded single diamond supported ladder circuit having a metallized diamond layer and a topw of 50 (all dimensions in microns); however, such a listing and values are exemplary only and should not in any way limit the scope of the claims appended herewith. With reference to Table 4, the Karp loaded circuit provides an efficiency of 0.816%, whereas the anti-Karp loaded circuit provides an efficiency of 0.76% and the Karp loaded circuit with the metallized diamond layer provides an efficiency of 0.77%.

TABLE 4

Cold-Test and Large Signal Performance for Karp and
anti-Karp Loaded Single Diamond Ladder Circuits

| | |
|---|---|
| Pin (mW) | 30 |
| V (V) | 12000 |
| I (mA) | 7 |
| beam height (microns) | 20 |
| beam width (microns) | 175 |
| Equiv radius (microns) | 33.38 |
| 1.5 Brillouin (T) | 0.298 |

| | Kavg (Ohms) | atten (dB/mm) | saturated length (mm) | saturated gain (dB) | saturated efficiency (%) | saturated power (W) |
|---|---|---|---|---|---|---|
| Karp, topw = 50 | 30 | 14 | 9.24 | 13.59 | 0.816 | 0.685 |
| Anti-Karp, gap = 260 | 37 | 15.9 | 9.07 | 13.36 | 0.76 | 0.64 |
| Karp, topw = 50, Metallized diamond | 29.2 | 14.5 | 9.42 | 13.36 | 0.77 | 0.65 |

Figure 12:
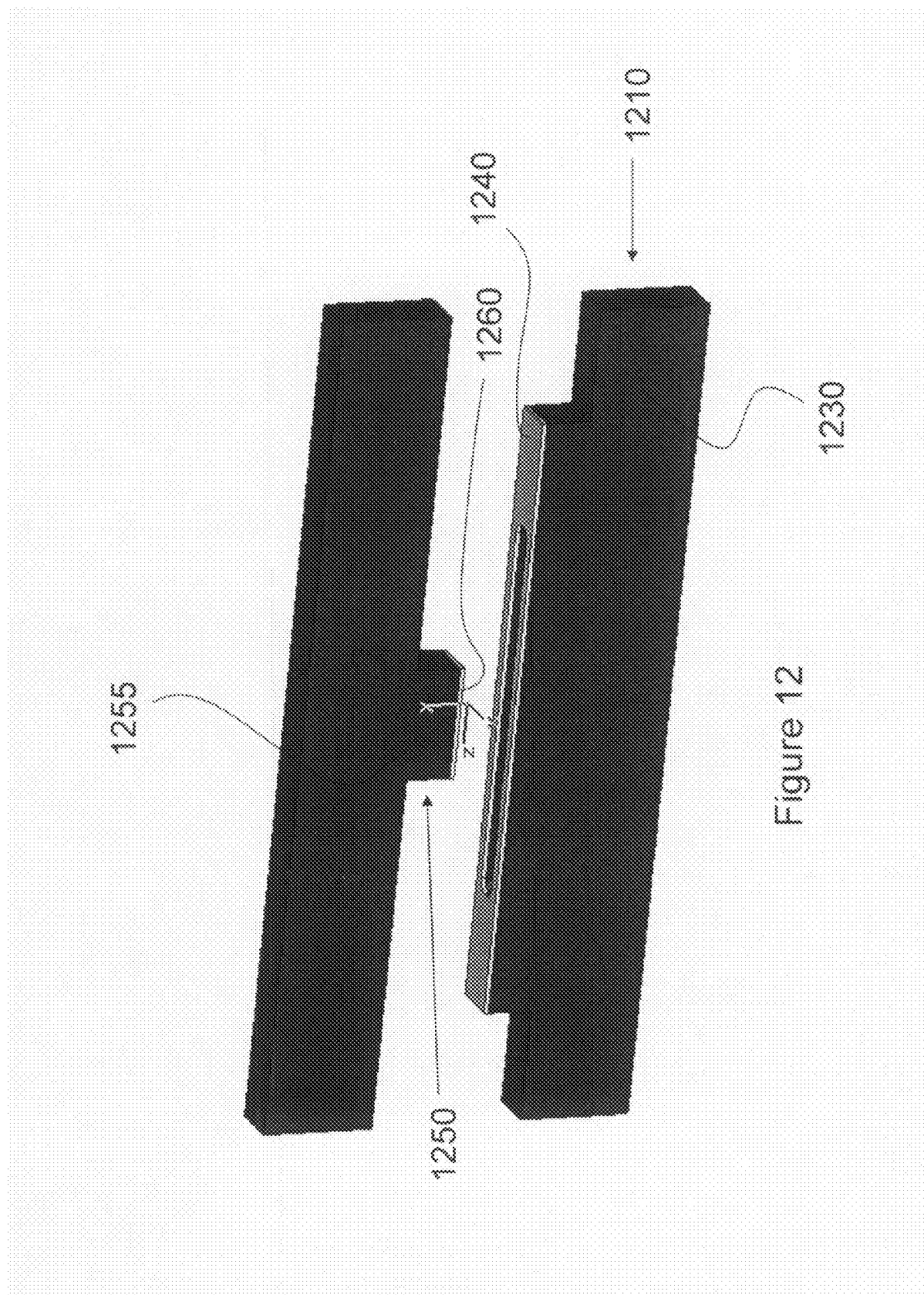
FIG. 12 is a schematic representation of another ladder circuit according to an additional embodiment of the present subject matter.

FIG. 12 is a schematic representation of another ladder circuit according to an additional embodiment of the present subject matter. The configuration illustrated in FIG. 12 is a Karp loaded single diamond supported ladder circuit 1210 having a body 1230 fabricated from a material of exceptional thermal conductivity such as, but not limited to, synthetic diamond, and certain surfaces 1240 of the body 1230 coated with a layer of electro-conductive material such as gold, silver, platinum, chromium, copper or a composite thereof. Of course, an optional coating layer may be interposed between the diamond structure and the conductive coating (e.g., Ag, Cr or Mo) to enhance the bonding between gold and the diamond structure. In one embodiment, the Karp loaded ladder circuit 1210 includes a ridge 1250 comprising a body 1255 of diamond and a metallized layer 1260 deposited on selected portions thereof. This ridge 1250 may extend the entire longitudinal length of the corresponding ladder circuit, may terminate prior to or overlap the proximate and distal axial ends of the ladder circuit, and/or may be periodic along the longitudinal length of the corresponding ladder circuit.

Figure 13:
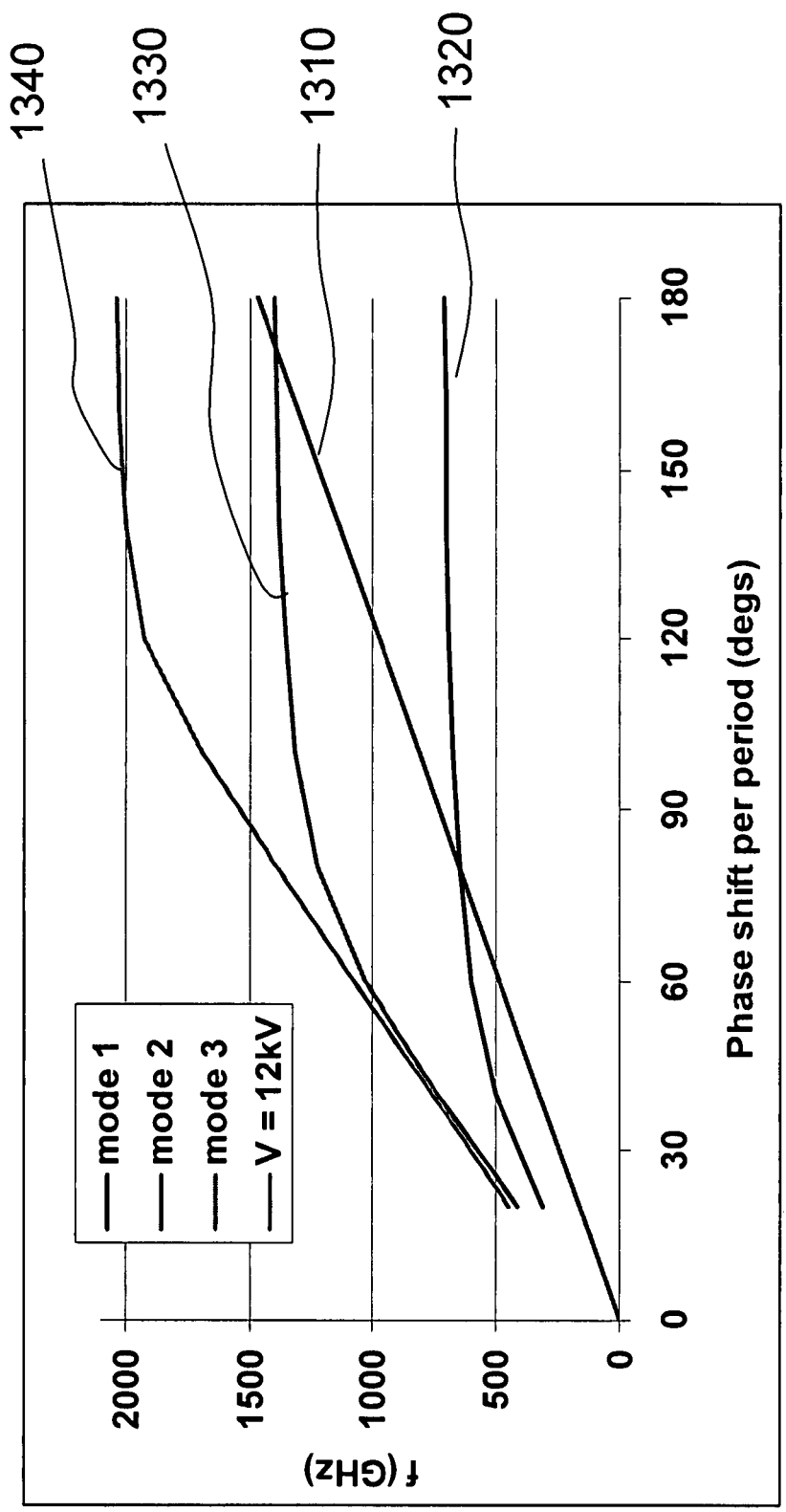
FIG. 13 is a graph showing a dispersion relation ($\omega$-$\beta$ diagram) for a circuit according to an embodiment of the present subject matter.

FIG. 13 is a graph showing a dispersion relation ($\omega$-$\beta$ diagram) for the diamond supported ladder circuit of FIG. 12 showing three modes of operation. With reference to FIG. 13, the dispersion was computed for each of the parameters listed in Table 5 for an electron beam having a voltage of 12 kV represented by phase velocity line 1310; however, such a listing and values are exemplary only and should not in any way limit the scope of the claims appended herewith. A primary mode represented by line 1320 reflects the dispersion for the optimized set of circuit dimensions provided below in Table 5. The secondary and tertiary modes are represented by lines 1330, 1340, respectively. As illustrated, for a 12 kV electron beam a ladder circuit in the primary mode 1320 would provide an operating point of approximately BL=80 and a ladder circuit in the secondary mode 1330 would provide an operating point of approximately BL=170. Simulations of the performance of this ladder circuit indicate that it would produce a saturated output power of approximately 500 mW. While the mode diagram provides similar results to that illustrated in FIG. 10, the bandwidth is increased slightly. Table 5 also lists the large signal data for the configuration shown in FIG. 12. This configuration replaces the solid metal loading ridge with metallized diamond, which is amenable to a fabrication scheme of a BWO circuit having two parallel diamond layers. The results show a slight reduction in efficiency with the metallized diamond configuration. Utilizing the embodiment illustrated in FIG. 12, the electron beam current and electron beam width was varied while keeping current density constant. With reference to Table 5, a maximum efficiency of 0.78% may be obtained utilizing a 20×200 micron, 8 mA beam having an output power of approximately 750 mW.

TABLE 5

Cold-Test and Large Signal Performance for Karp Loaded Single Diamond
Ladder Circuit as a Function of Beam Width and Beam Current.

| | | | | atten (db/mm) | | 14.5 | |
|---|---|---|---|---|---|---|---|
| | | | | Pin (mW) | | 30 | |
| | | | | V (kV) | | 12 | |
| | | | | Beam ht (μm) | | 20 | |

| beam width (μm) | I (mA) | Kavg (Ohms) | Equiv rad (μm) | saturated length (mm) | saturated gain (dB) | saturated efficiency (%) | saturated power (W) |
|---|---|---|---|---|---|---|---|
| 250 | 10 | 20.4 | 39.89 | 10.02 | 14.7 | 0.738 | 0.885 |
| 225 | 9 | 22.6 | 37.85 | 9.83 | 14.38 | 0.761 | 0.822 |
| 200 | 8 | 25.5 | 35.68 | 9.6 | 13.96 | 0.78 | 0.746 |
| 175 | 7 | 29.2 | 33.38 | 9.42 | 13.36 | 0.77 | 0.650 |
| 150 | 6 | 33.8 | 30.90 | 9.19 | 12.45 | 0.73 | 0.527 |
| 125 | 5 | 39.0 | 28.21 | 9.0 | 11.18 | 0.66 | 0.393 |

TABLE 5-continued

Cold-Test and Large Signal Performance for Karp Loaded Single Diamond
Ladder Circuit as a Function of Beam Width and Beam Current.

| 100 | 4 | 44.0 | 25.23 | 8.91 | 9.59 | 0.57 | 0.273 |
| 75  | 3 | 50.0 | 21.85 | 8.9  | 7.57 | 0.48 | 0.172 |

An estimate of efficiency may be obtained from the computer prediction presented above. For an output power of 746 mW, a beam voltage of 12 kV and a beam current of 8 mA, the RF efficiency is 0.78% (assuming a beam interception of 1% (0.96 W), that the RF losses are 30% of the output (0.224 W), and that the respective oscillator or BWO consumes 1.0 W). For such a low RF efficiency, the spent electron beam is little perturbed and at least 90% of the spent beam energy may be recovered. The collector dissipation would then be 0.1*(96.0−0.224−0.96−0.746)=9.407 W. Under the aforementioned assumptions, the efficiency of a combination oscillator and amplifier circuit according to an embodiment of the present subject matter would be 6.58%. Following the same procedure, if the collector efficiency were increased to 94%, the overall efficiency would be 10%. A collector efficiency as high as 95.8% has been reported for a TWT with an RF efficiency of 0.53%. A few sample predicted efficiencies are presented below in Table 6; however, such a listing and values are exemplary only and should not in any way limit the scope of the claims appended herewith.

TABLE 6

Efficiency Estimates

| Source  | Circuit Type | V (kV) | I (mA) | RF Efficiency (%) | Power Out (W) | Overall Efficiency with 90% Depression (%) | Collector Depression for 10% Efficiency (%) |
|---------|--------------|--------|--------|-------------------|---------------|--------------------------------------------|---------------------------------------------|
| Table 7 | Karp         | 12     | 8      | 0.78              | 0.746         | 6.58                                       | 94                                          |
| Table 7 | Karp         | 12     | 7      | 0.77              | 0.650         | 5.9                                        | 95.4                                        |
| Table 4 | Ladder       | 12     | 7      | 0.629             | 0.528         | 4.9                                        | 96.7                                        |

Exemplary processes for fabricating a backward wave oscillator suitable for use with the instant disclosure have been disclosed in U.S. Pat. No. 7,037,370, entitled "Free-Standing Diamond Structure and Methods," by G. Mearini and the named inventor herein, the disclosure of which is incorporated herein in its entirety.

Figure 14:
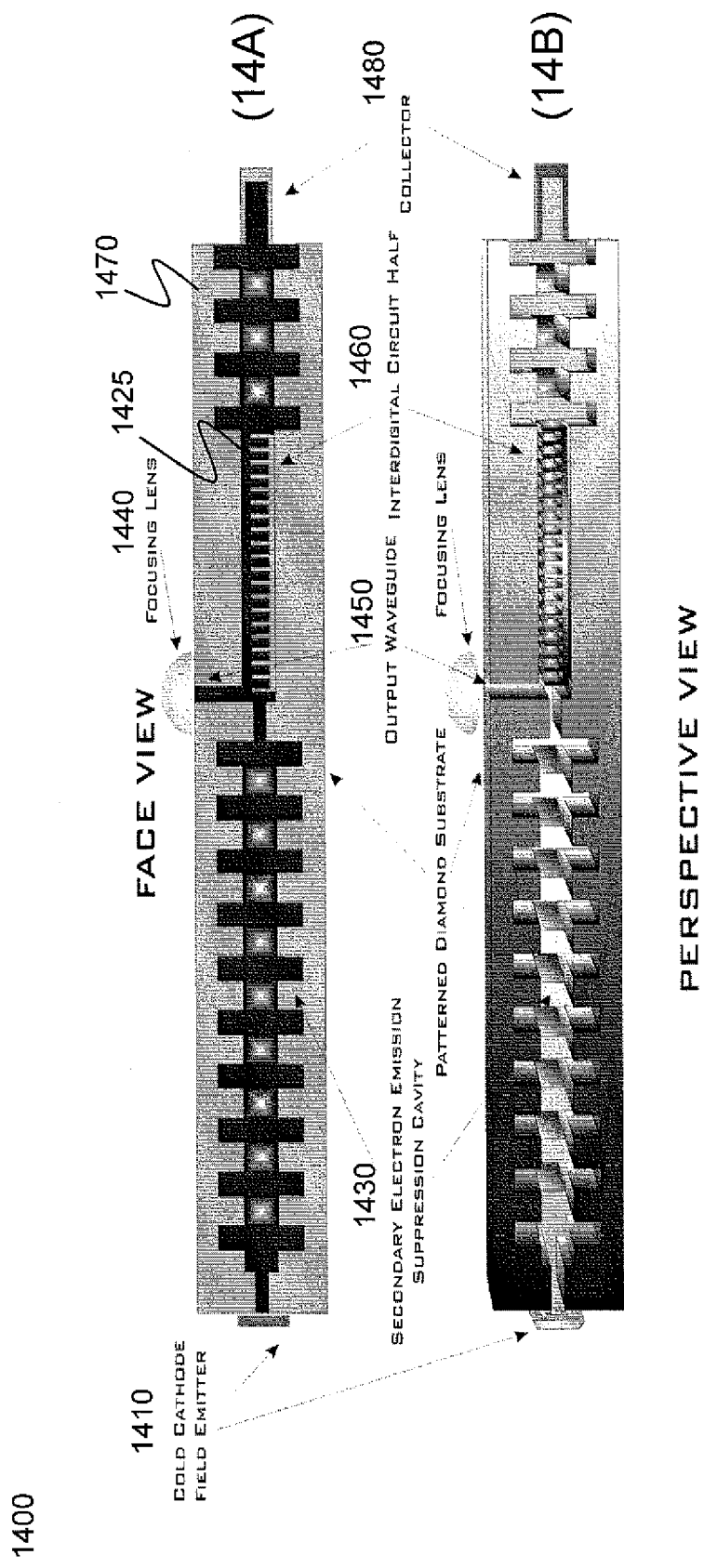
FIG. 14 schematically represents an exemplary configuration for a backward wave oscillator.

FIG. 14 schematically represents an exemplary configuration for a backward wave oscillator according to one embodiment of the disclosure. Referring to the exemplary miniature sub-mm BWO 1400 of FIG. 14A, the face view shows cold cathode emitter 1410 positioned at one end of the BWO 1400 while the collector 1480 is positioned at the opposite end. Using a cold cathode source such as Spindt-type, field emission cathode is optional and other electron emitting sources can be used without departing from the principles of the disclosure. The field emission cathode is a preferred choice because it can create much higher current density as compared with thermionic cathode. The secondary electron emission suppression cavity 1430 is positioned proximal to the electron source. Its purpose is to prevent electrical breakdown due to cascading secondary emission long the diamond surface. In another embodiment, the electron gun is designed with smooth walls (thereby obviating the need for a suppression cavity.)

Conventional means can be used for coupling the electron source (e.g., electron gun) to the slow wave circuit. For example, the electron gun can be coupled to the slow wave circuit using mechanical means. In one embodiment, the entire electron gun and the slow wave circuit can be fabricated as one structure, eliminating problems of alignment.

The focusing lens 1440 is placed at the output of the BWO to serve as the entry element for a quasi optical transmission system. The BWO can also be coupled to standard WR-3 waveguide by adapting conventional microwave techniques. The waveguide is not visible in FIG. 14.

The interdigital wave circuit 1460 is shown as an integrated unit with fingers 1425 protruding toward the center of the circuit. In one embodiment, the interdigital wave circuit (or slow wave circuit) is fabricated as complementary halves prior to its assembly. The body of the interdigital circuit can be fabricated from a material of exceptional thermal conductivity. Exemplary materials include synthetic diamond. Synthetic diamond is particularly suitable as it provides high thermal conductivity enabling efficient heat transmission.

Diamond also has a high dielectric strength to withstand the electron gun voltages and very a low loss tangent to minimize RF losses.

To improve performance, certain surfaces of the interdigital circuit can be coated with electroconductive material such as gold, silver or copper. An optional coating layer can be interposed between the diamond structure and the conductive coating (e.g., Ag, Cr or Mo). The coating layer may be provided to enhance the bonding between gold and the diamond structure.

The secondary electron emission suppression cavity 1430 is comprised of corrugated diamond, so constructed to interrupt cascading secondary electron emission from causing electrical breakdown. It can be fabricated at the same time as the electron gun and the slow wave circuit.

Figure 15:
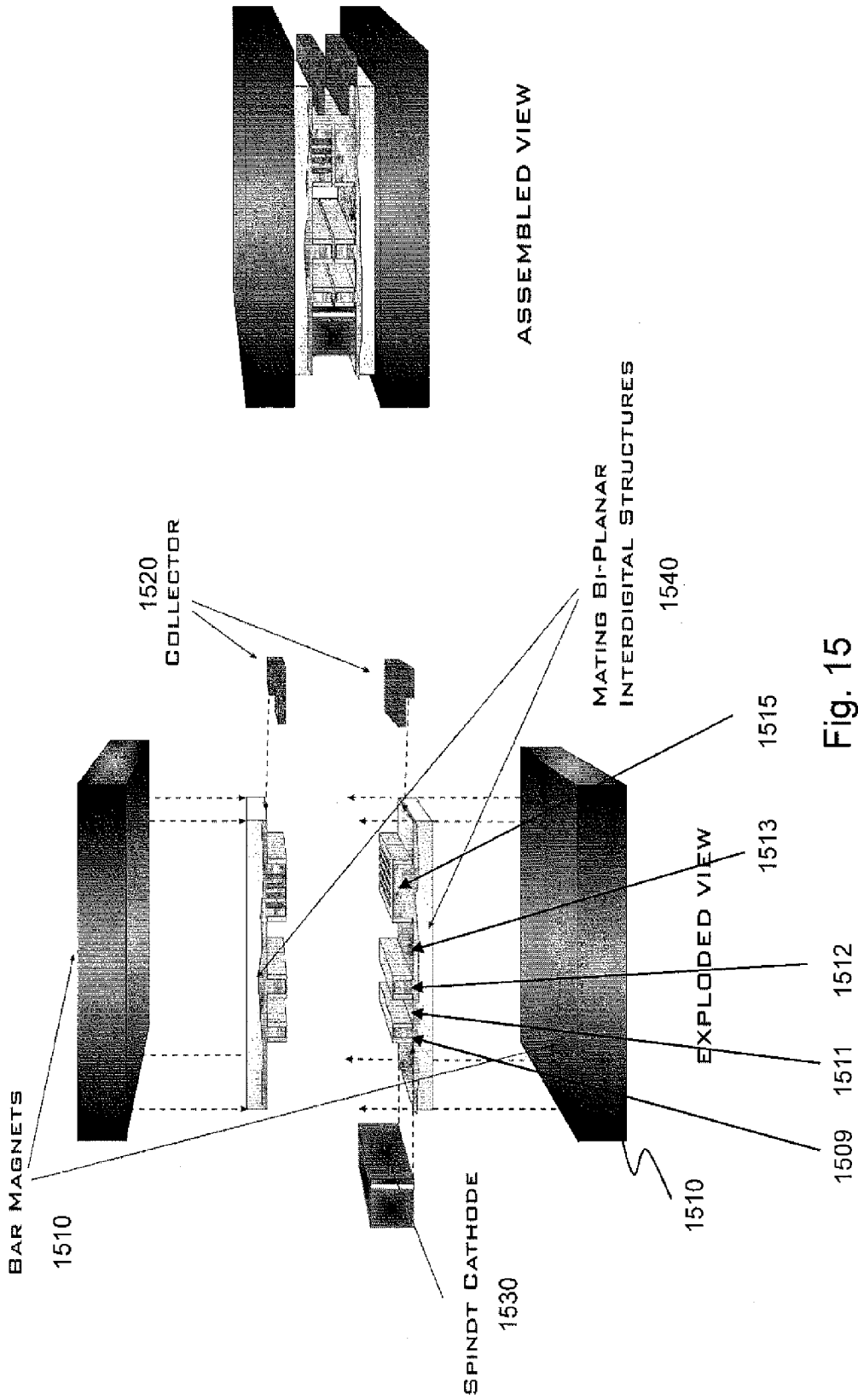
FIG. 15 shows the assembly of a backward wave oscillator according to one embodiment of the disclosure.

A view of an exemplary embodiment of the component parts of the BWO electron gun, magnets, slow wave circuit and collector is shown in FIG. 15. Referring to FIG. 15, the exploded view shows bar magnets 1510 having interposed between them mating biplanar interdigitat structures (circuits) 1540. Spindt cathode 1530 is positioned opposite the collector 1520 to provide electron beam (not shown). In one embodiment, the magnets are supported by a non-magnetic frame (not shown) that centers the BWO within the magnetic field. The magnetic material can be made thicker to increase the magnetic flux. In another embodiment, the minimum spacing between the magnets can be 2.5 mm, which would accommodate a short section of standard WR3 waveguide.

Referring to the embodiment of FIG. 23, a mounting structure is formed on the mating bi-planar structures 1540. In one embodiment, the structure is fabricated as complementary halves and then combined to form a BWO. Referring to the exploded view of FIG. 15, a diamond dielectric standoff 1511 is shown between focus electrode 1509 and first anode 1512. The dielectric insulation between first and second anode is identified as 1513. Slow wave circuit 1515 is shown as having a plurality of interdigital structures (fingers) coated with a conductive material. The slow-wave circuit 1515 can also act as a second anode. The frequency of the oscillator can be controlled by varying the voltage difference between the first anode and the slow-wave circuit. Bar magnets 1510 receive the assembled BWO which, in the exemplary embodiment of FIG. 15, includes Spindt Cathode 1530 and Collectors 1520. The lower the potential difference between the first and second anode, the lower the frequency of the oscillator.

With reference to the assembled view of FIG. 15, after the electrons pass through the complementary structures of first anode 1511 and slow-wave circuit 1515, they are captured by collector 1520. The collector 1520 can be biased to be closer in potential to the cathode than to the first or second anodes. As the electrons impact collector electrodes 1520, little heat is generated and much of the power of the electron beam is captured by the collectors 1520.

As shown by the various configurations and embodiments illustrated in FIGS. 1-13, an apparatus and method for producing electromagnetic oscillations have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A device for providing electromagnetic oscillations comprising:
   one or more electron beam generators for providing a first and a second electron beam;
   one or more magnetic field generators for focusing said first and second electron beams;
   an oscillator comprising a slow wave circuit having a structure of an electrically non-conducting material with metallized surfaces adjacent said first electron beam;
   an amplifier comprising a slow wave circuit having a structure of an electrically non-conducting material with metallized surfaces adjacent said second electron beam and electrically connected to said oscillator; and
   a single vacuum envelope containing at least said oscillator and said amplifier.

2. The device of claim 1 wherein said oscillator is a backward wave oscillator.

3. The device of claim 2 wherein said amplifier is a traveling wave tube.

4. The device of claim 1 wherein said amplifier is a traveling wave tube.

5. A device for producing electromagnetic oscillations comprising:
   a single vacuum envelope;
   a pair of electron beam generators contained within said envelope for generating a pair of substantially parallel electron beams;
   a pair of side-by-side slow wave circuits contained within said envelope, one circuit being positioned so that one electron beam induces electromagnetic oscillations in said circuit, the other circuit being positioned (i) to receive said electromagnetic oscillations, and (ii) to interact with the other electron beam to amplify said electromagnetic oscillations in said circuit.

6. A device for providing electromagnetic oscillations at a sub-millimeter wavelength comprising:
   a first and a second electron beam generator for generating a first and a second electron beam, each of said electron beam generators comprising a source of electrons, a collector of electrons, and means for accelerating electrons emitted from said source in the direction of said collector;
   an oscillator comprising a first slow wave circuit disposed intermediate said source and said collector of said first electron beam generator, said first electron beam passing in sufficient proximity to said first slow wave circuit to induce electromagnetic oscillations in said first slow wave circuit and to interact with said induced oscillations for providing electromagnetic oscillations;
   an amplifier comprising a second slow wave circuit positioned to receive the electromagnetic oscillations from said first slow wave circuit, said second electron beam passing in sufficient proximity to said second slow wave circuit to amplify said electromagnetic oscillations; and
   a single vacuum envelope containing said electron beam generators, said first slow wave circuit, and said second slow wave circuit.

7. The device of claim 6 wherein said first and second electron beams are substantially parallel and are directed in the same direction, and said first and second slow wave circuits are positioned side-by-side with the output of said first slow wave circuit positioned adjacent the input of said second slow wave circuit.

8. The device of claim 7 wherein said first stow wave circuit includes a biplanar, interdigital periodic structure of electrically non-conducting material having one or more metallized surfaces adjacent said first electron beam.

9. The device of claim 8 wherein said second slow wave circuit includes a biplanar, interdigital periodic structure of electrically non-conducting material having one or more metallized surfaces adjacent said second electron beam.

10. A device for providing electromagnetic oscillations comprising:
   one or more electron beam generators for providing a first and a second electron beam;
   one or more magnetic field generators for focusing said first and second electron beams;
   a first slow wave circuit for guiding electromagnetic oscillations having a first periodic structure of electrically non-conducting material with metallized surfaces adjacent said first electron beam; and
   a second slow wave circuit to receive said electromagnetic oscillations from said first slow wave circuit and for guiding electromagnetic oscillations having a second periodic structure of electrically non-conducting material with metallized surfaces adjacent said second electron beam,
   wherein the phase shift of said electromagnetic oscillations per period propagating in said second periodic structure is different than the phase shift of said electromagnetic oscillations per period propagating in said first periodic structure.

11. The device of claim 10 wherein the phase shift of said electromagnetic oscillations per period traveling through said second periodic structure is less than the phase shift of said electromagnetic oscillations per period traveling through said first periodic structure.

12. The device of claim 10 wherein said first periodic structure is an interdigital structure.

13. The device of claim 12 wherein said second periodic structure is an interdigital structure.

14. The device of claim 12 wherein said second periodic structure is a ladder structure.

15. The device of claim 10 wherein said first slow wave circuit forms a backward wave oscillator.

16. The device of claim 10 wherein said second slow wave circuit forms a traveling wave tube.

17. A device for providing electromagnetic oscillations comprising:
   a first and a second electron beam generator for providing a first and a second electron beam, each electron beam generator comprising a source of electrons, a collector of electrons, and means for accelerating electrons emitted from said source in the direction of said collector;
   a first slow wave circuit disposed intermediate said source and said collector of said first electron beam generator, said first electron beam passing in sufficient proximity to said first slow wave circuit to induce electromagnetic oscillations in said first slow wave circuit and to interact with said induced oscillations for providing electromagnetic oscillations, said first slow wave circuit being defined in two planes and said first electron beam passing between said planes; and
   a second slow wave circuit positioned to receive said electromagnetic oscillations from said first slow wave circuit, said second electron beam passing in sufficient proximity to said second slow wave circuit to amplify said electromagnetic oscillations propagating in said second slow wave circuit.

18. The device of claim 17 wherein said first slow wave circuit comprises an interdigital, periodic structure of an electrically non-conducting material with one or more surfaces adjacent said electron beam being metallized, said structure having a plurality of digits positioned on a first plane and a plurality of digits positioned on a second plane, wherein said first electron beam passes between the first and second planes.

19. The device of claim 18 wherein said electrically non-conducting material is diamond.

20. The device of claim 17 wherein said second slow wave circuit comprises a bi-planar, periodic structure of an electrically non-conducting material with surfaces adjacent said second electron beam being metallized.

21. The device of claim 20 wherein said bi-planar periodic structure is an interdigital structure having a plurality of digits positioned on a first plane and a plurality of digits positioned on a second plane, wherein said second electron beam passes between the first and second planes.

22. The device of claim 20 wherein said bi-planar periodic structure is a ladder structure having a plurality of vanes positioned on a first plane and a plurality of vanes positioned on a second plane, wherein said second electron beam passes between the first and second planes.

23. The device of claim 17 wherein said second slow wave circuit comprises a periodic ladder structure of an electrically non-conducting material with surfaces adjacent said second electron beam being metallized.

24. The device of claim 23 further comprising a structure opposing said periodic ladder structure for loading said ladder structure in a Karp configuration.

25. The device of claim 23 further comprising a structure opposing said periodic ladder structure for loading said ladder structure in an anti-Karp configuration.

26. A device for providing electromagnetic oscillations comprising:
   a first and a second electron beam generator for providing a first and a second electron beam, each of said electron beam generators comprising a source of electrons, a collector of electrons, and means for accelerating electrons emitted from said source in the direction of said collector;
   a first slow wave circuit disposed intermediate said source and said collector of said first electron beam generator, said first electron beam passing in sufficient proximity to said first slow wave circuit to induce electromagnetic oscillations in said first slow wave circuit and to interact with said induced oscillations for providing electromagnetic oscillations; and
   a second slow wave circuit positioned intermediate said source and said collector of said second electron beam generator and to receive said electromagnetic oscillations from said first slow wave circuit, said second electron beam passing in sufficient proximity to said second slow wave circuit to amplify said electromagnetic oscillations in said second slow wave circuit,
   wherein said first electron beam interacts with the full propagation strength of the electromagnetic oscillations propagating in said first slow wave circuit.

27. The device of claim 26 wherein said second electron beam interacts with the full propagation strength of the electromagnetic oscillations propagating in said second slow wave circuit.

28. A device for providing electromagnetic oscillations having a sub-millimeter wavelength, said device comprising:
   vacuum envelope;
   a pair of electron beam generators contained in said vacuum envelope, each of said electron beam generators comprising a source of electrons, a collector of electrons, and means for accelerating electrons emitted from said source in the direction of said collector for generating a pair of substantially parallel electron beams at substantially the same voltage;
   one or more magnetic field generators for focusing said electron beams;
   a pair of side-by-side slow wave circuits, each slow wave circuit comprising a periodic structure of diamond having selected surfaces overlaid with gold, each of said slow wave circuits being positioned between the source and collector of a respective electron beam generator so that the gold overlaid surfaces are adjacent the respective electron beam, the periodic structure of each slow wave circuit being selected so that one slow wave circuit operates as a backward wave oscillator which feeds the electromagnetic oscillations induced therein into the other slow wave circuit which operates as an amplifier.

* * * * *